(12) United States Patent
Kimura

(10) Patent No.: US 7,443,214 B2
(45) Date of Patent: Oct. 28, 2008

(54) PLL CIRCUIT AND FREQUENCY SETTING CIRCUIT USING THE SAME

(75) Inventor: Katsuji Kimura, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 141 days.

(21) Appl. No.: 11/126,294

(22) Filed: May 11, 2005

(65) Prior Publication Data
US 2005/0253633 A1 Nov. 17, 2005

(30) Foreign Application Priority Data
May 13, 2004 (JP) ............................. 2004-143752

(51) Int. Cl.
*H03L 7/06* (2006.01)
(52) U.S. Cl. ....................... 327/156; 327/147
(58) Field of Classification Search ................ None
See application file for complete search history.

(56) References Cited

U.S. PATENT DOCUMENTS

| | | | | |
|---|---|---|---|---|
| 4,628,272 A * | 12/1986 | Davis et al. | ................ | 329/336 |
| 5,325,317 A * | 6/1994 | Petersen et al. | ............ | 708/300 |
| 5,334,945 A * | 8/1994 | Yokoya et al. | .............. | 330/129 |
| 5,594,383 A * | 1/1997 | Tamba | ....................... | 327/552 |
| 5,606,284 A * | 2/1997 | Tamesue et al. | ............ | 330/129 |
| 6,114,902 A * | 9/2000 | Beatson et al. | .............. | 327/553 |
| 6,172,569 B1 * | 1/2001 | McCall et al. | .............. | 330/303 |
| 6,323,692 B1 * | 11/2001 | Tsinker | ........................ | 327/12 |
| 6,549,074 B2 * | 4/2003 | Ugajin et al. | ............... | 330/258 |
| 6,842,710 B1 * | 1/2005 | Gehring et al. | ............. | 702/107 |
| 6,977,542 B2 * | 12/2005 | Ganeshan et al. | ........... | 327/553 |
| 7,019,567 B2 * | 3/2006 | Katakura | .................... | 327/129 |
| 7,051,063 B2 * | 5/2006 | Kaczynski et al. | .......... | 708/819 |

(Continued)

FOREIGN PATENT DOCUMENTS

EP    1 187 326 A    3/2002

(Continued)

OTHER PUBLICATIONS

Venugopal Gopinathan, et al., "Design Considerations for High-Frequency Continuous-Time Filters and Implementation of an Antialiasing Filter for Digital Video", IEEE Journal of Solid-State Circuits, vol. 25, No. 6, Dec. 1990, pp. 1368-1378.

(Continued)

*Primary Examiner*—Cassandra Cox
(74) *Attorney, Agent, or Firm*—McGinn IP Law Group, PLLC

(57) ABSTRACT

Disclosed is a PLL circuit in which an AC signal with a predetermined frequency is supplied as an input signal to a phase shifter comprising an OTA and a capacitor, and a phase comparator that receives the input signal to the phase shifter and an output signal from the phase shifter outputs a signal corresponding to a phase difference between the input signals. Control is performed so that the phase difference given by the phase shifter becomes a constant value by changing a transconductance (gm) of at the OTA constituting the phase shifter, using an output voltage of an amplifier for amplifying a DC voltage of the output signal of the phase comparator as a control signal.

7 Claims, 33 Drawing Sheets

U.S. PATENT DOCUMENTS

2002/0113725 A1\* 8/2002 Katoh .................. 341/155

FOREIGN PATENT DOCUMENTS

| GB | 2 249 915 A | 5/1992 |
|---|---|---|
| GB | 2 296 835 A | 7/1996 |
| GB | 2 323 985 A | 10/1998 |
| JP | 2973491 | 9/1999 |
| JP | 2000-209066 | 7/2000 |

OTHER PUBLICATIONS

European Search Report dated Oct. 11, 2005.

\* cited by examiner

FIG. 26

| n | | Rin | C1 | L2 | C3 | L4 | C5 | L6 | C7 |
|---|---|---|---|---|---|---|---|---|---|
| 2 | | 1 | 1.4142 | 1.4142 | | | | | |
| ⋮ 3 | | 0 | 1.4142 | 0.7071 | | | | | |
| | | 1 | 1 | 2 | 1 | | | | |
| ⋮ 4 | | 0 | 1.5 | 1.333 | 0.5 | | | | |
| | | 1 | 0.7654 | 1.6476 | 1.8478 | 0.7654 | | | |
| 2 ⋮ 5 | | 0 | 1.9307 | 1.5772 | 1.0624 | 0.3627 | | | |
| | | 1 | 0.618 | 1.618 | 2 | 1.618 | 0.618 | | |
| ⋮ 6 | | 0 | 1.5451 | 1.6944 | 1.362 | 0.8944 | 0.309 | | |
| | | 1 | 0.5176 | 1.4142 | 1.8319 | 1.9319 | 1.4142 | 0.5176 | |
| ⋮ | | 0 | 1.3529 | 1.7593 | 1.8529 | 1.2018 | 0.7579 | 0.2588 | |
| | | 1 | 0.4455 | 1.247 | 1.8019 | 2 | 1.8019 | 1.247 | 0.4495 |
| ⋮ 7 | | 0 | 1.3575 | 1.7988 | 1.8588 | 1.3972 | 1.055 | 0.5555 | 0.2225 |

US 7,443,214 B2

PLL CIRCUIT AND FREQUENCY SETTING CIRCUIT USING THE SAME

FIELD OF THE INVENTION

The present invention relates to a PLL (Phase Locked Loop) circuit and a frequency setting circuit of a filter circuit, using the PLL. More specifically, the invention relates to the PLL circuit formed on a semiconductor integrated circuit and the frequency setting circuit of a gm-C filter circuit which comprises at least an operational transconductance amplifier (referred to as an "OTA") and a capacitor, using the PLL.

BACKGROUND OF THE INVENTION

FIG. 28 is a diagram showing the typical configuration of a PLL circuit and a frequency setting circuit of a gm-C filter circuit (a filter including an OTA and a capacitor is hereinafter referred to as a "gm-C filter") using the PLL. Conventionally, in the PLL circuit of this type and the frequency setting of a gm-C filter, using the PLL, a gm-C master filter (a second-order gm-C LPF) 111 including an OTA and a capacitor is used as a phase shifter for shifting a phase of 90 degrees, as shown in FIG. 28. An XNOR (exclusive NOR) circuit 115 which receives an input signal to the gm-C master filter 111 and an output signal from the gm-C master filter 111 is used as a phase detector (phase comparator) and a direct current (DC) voltage VCON corresponding to a phase difference between two received signals is obtained through a loop filter (LPF: low-pass filter) 117 receiving an output signal of an inverter 116 that inverts an output signal of the XNOR circuit 115. The signal VCON is used as a control voltage to change the value of the transconductance gm of the OTA. The phase difference of an oscillating frequency from that of a reference frequency $f_{REF}$ is set to 90 degrees, thereby setting the cutoff frequency of a gm-filter circuit (slave filter) 112 to a predetermined value. Each of interface circuits 113 and 114 converts an AC (alternating current) signal to a logic signal (a rectangular wave).

It is assumed that the phase detector (termed also as "phase comparator") outputs a signal corresponding to the phase difference between two input signals (refer to Non-patent Document 1).

Specifically, if the product of the two input signals is to be output, a multiplier may also be employed as the phase comparator. However, as shown in FIG. 28, the XNOR circuit 115 or an XOR circuit, which are simple digital circuits can be employed.

As described above, in case the phase comparator composed by one of the multiplier, XOR circuit, and XNOR circuit is employed, the simplest phase locked loop (PLL) can be configured. Then, as described in a text book or the like, when the phase difference between the two input signals is 90 degrees ($\pi/2$), the loop is pulled in, and locked. When the XOR circuit is used as the phase comparator, for example, and when the phase difference between the two input signals becomes 90 degrees ($\pi/2$), the DC voltage of an output signal becomes a VDD/2. Then, the loop is pulled in and locked. At this point, the frequency of the output signal is exactly two times as many as the frequency of the two input signals (with the phases thereof being different to each other by 90 degrees). That is, in the simplest phase locked loop (PLL) in which the XOR circuit is employed as the phase comparator, the phase difference from the reference frequency is just 90 degrees ($\pi/2$) at the time of the being locked. As described above, it can be seen that in case that the PLL is configured so that the phase difference becomes 90 degrees, a phase adjusting element such as a differentiator, an integrator, a filter, or the like, by which the phase advancement or delay of 90 degrees is obtained, can be used in addition to a VCO (Voltage Controlled Oscillator) circuit.

FIG. 29 is a diagram showing the configuration of an OTA circuit. As shown in FIG. 28, the OTA circuit includes a transistor M3 operated in a linear operating region in place of source-degeneration resistances of transistors M1 and M2 which constitute a differential pair, and a gate voltage VG of the transistor M3 is adjusted so that the transistor M3 operated in the linear operating region is controlled to equivalently change the source-degeneration resistance, thereby setting the gm (transconductance) value of the OTA variably.

The gm-C master filter circuit 111 including an OTA and a capacitor is a second-order LPF. Then, if there is no insertion loss of the second-order LPF, for simplicity, the transfer characteristic of the second-order LPF becomes one for a DC component. Thus, the transfer characteristic (function) of the second-order LPF is expressed as follows:

$$H_{LPF}(s) = \frac{\omega_0^2}{s^2 + \left(\frac{\omega_0}{Q}\right)s + \omega_0^2} \quad (1)$$

where $\omega_0^2$ indicates a pole frequency and Q indicates a pole-Q value.

FIG. 30 shows the amplitude characteristic of the gm-C master filter circuit 111 with the Q used as a parameter. FIG. 31 shows the phase characteristic of the gm-C master filter circuit 111 with the Q used as the parameter. That is, the gm-C master filter circuit 111 in FIG. 28 generates the phase difference of 0 degrees to −180 degrees, centering on −90 degrees, as a phase shifter. Particularly, the degree of a change becomes large around −90 degrees. Accordingly, the gm-C master filter circuit 111 can be functioned as a −90-degree phase shifter.

On the other hand, the XNOR circuit 115 is used as the phase detector. Though no frequency difference is generated between the reference signal and the output signal of the second-order LPF (phase shifter), the phase difference between them is generated. Thus, the output waveform of the XNOR circuit 115 becomes the rectangular wave, and its duty becomes 50% when the phase difference is 90 degrees. In this case, the rectangular wave has wave height values of a power supply voltage VDD and a ground potential. Thus, the DC voltage component of the output signal of the XNOR circuit 115 (phase detector) becomes the VDD/2. Accordingly, when the loop of the PLL is pulled in, setting is so performed that the output voltage of the loop filter (LPF) is becomes the VDD/2, generally. Alternatively, if a loop gain is to be enhanced, an active PI (proportional+integral) loop filter that uses an OP amplifier for the loop filter (LPF) is configured as shown in FIG. 32, in which the voltage VDD/2 is applied to the plus terminal (non-inverting terminal) of an OP amplifier OP1.

As described above, when the second-order LPF is employed as the phase shifter, the frequency of its output becomes a cutoff frequency when the phase of its output becomes −90 degrees (meaning the delay of the phase by 90 degrees), the amplitude level of its output becomes −3 dB, and the amplitude value of its output is attenuated to $1/\sqrt{2}$. Accordingly, the cutoff frequency of the second-order LPF (phase shifter) becomes $\omega_0$ in the equation (1).

In the Nonpatent Document 1 that is a conventional art, when the second-order LPF constituting the phase shifter is assumed to be a single-input biquad second-order LPF as shown in FIG. 33, the following equation is derived:

$$\frac{V_{LPF}}{V_{in}} = \frac{\frac{g_{m1}g_{m3}}{C_{L2}C_3}}{s^2 + s\frac{g_{m2}}{C_3} + \frac{g_{m3}g_{m4}}{C_{L2}C_3}} \quad (2)$$

where $$\omega_0 = \sqrt{\frac{g_{m3}g_{m4}}{C_{L2}C_3}} \quad (3)$$

$$\frac{\omega_0}{Q} = \frac{g_{m2}}{C_{L2}} \quad (4)$$

Now, if $g_{m3}=g_{m4}=g_m$ and $C_{L2}=C_2=C$ hold, the cutoff frequency becomes as follows, using Equation (3).

$$f_{CMASTER} = \frac{g_m}{2\pi C} \quad (5)$$

When $g_m$ is assumed to be equal to 1/R and is replaced by an equivalent resistance, the above equation can be expressed as follows:

$$f_{CMASTER} = \frac{1}{2\pi CR} \quad (6)$$

Thus, the well known equation of a time constant can be obtained.

By locking $f_{CMASTER}$ to a reference frequency $f_{REF}$ in the PLL, the value of $g_m/C$ can be controlled to be constant. That is, when a driving current for each OTA constituting the gm-C filter is set to be equal to a driving current for each OTA constituting the second-order LPF, the gm value of each OTA constituting the gm-C filter and the gm value of each OTA constituting the second-order LPF, which is the phase shifter, can be matched. Then, a constant ratio between each capacitor constituting the gm-C filter and each capacitor constituting the second-order LPF can be expected. Thus, the relationship between the cutoff frequency of the second-order LPF, which is the phase shifter, and the cutoff frequency of the gm-C filter can be controlled to be constant.

Patent Document 1 discloses a configuration that includes a reference filter for receiving a reference signal, a phase comparator for comparing the phase of the output of the reference filter with the phase of the reference signal, a low-pass filter for smoothing the output of the phase comparator, and a comparator for comparing the output of the low-pass filter with a reference voltage. In this configuration, the output signal of the comparator is fed back to the reference filter and a main filter. In the reference filter, the gm or capacitor of the reference filter is changed according to the output of the comparator, and negative feedback is performed so that the phase difference at the frequency of the reference signal becomes 90 degrees.

Further, Patent Document 2 discloses a configuration in which a signal obtained by shifting the phase of an input signal at a reference filter by 90 degrees is supplied to a phase detection circuit. In this configuration, the phase detection circuit detects the phases of the input signal and the signal obtained by shifting the phase of the input signal by 90 degrees. The terminal voltage of a charging capacitor is controlled according to the output of the detection, for supply to a comparator, and then the output of the comparator is negatively fed back to the reference filter.

[Non-Patent Document 1]

V. Gopinathan, Y. P. Tsividis, K. -S. Tan, and R. K. Hester, "Design Considerations for High-Frequency Continuous-Time Filters and Implementation of an Antialising Filter for Digital Video." IEEE J. Solid-State Circuits, Vol. 25, No. 6, pp. 1368-1378, December 1990.

[Patent Document 1]

JP Patent Kokai Publication No. P2000-209066A (FIG. 3)

[Patent Document 2]

JP Patent No. 2973491 (FIG. 4)

SUMMARY OF THE DISCLOSURE

In the frequency setting circuit that uses the conventional PLL described above, due to manufacturing variations of transistors constituting the OTA and the manufacturing variations of a temperature characteristic and capacitance value thereof, it is necessary for DC voltage value of the output signal of the XNOR circuit constituting the phase detector to be changed according to the manufacturing variations of the transistors and the manufacturing variations of the temperature characteristic and the capacitance value. Thus, a change range of approximately ±20 degrees from −70 degrees to −110 degrees is generated in the phase difference. For this reason, a setting error of approximately ±20% is generated between the cutoff frequency of the second-order LPF, which is the phase shifter, and the cutoff frequency of the gm-C filter, thereby hindering mass production.

The invention disclosed in the present application is generally configured as follows.

A PLL circuit and a frequency setting circuit that uses the PLL circuit according to the present invention, have a phase locked loop (PLL) which includes a phase shifter comprising an OTA and a capacitor, said phase shifter receiving an alternating current (AC) signal with a predetermined frequency as an input signal; and a phase comparator for receiving the input signal to the phase shifter and the output signal from the phase shifter and outputting a signal corresponding to a phase difference between the received signals. In the PLL circuit and the frequency setting circuit, control is performed so that by changing the transconductance (gm) of at least one OTA constituting the phase shifter, using the output voltage of an amplifier that amplifies the DC voltage of the output signal of the phase comparator as a control signal, the phase difference given by the phase shifter becomes a constant value.

Alternatively, in the present invention, an alternating current (AC) signal with a predetermined frequency is supplied to a phase shifter including an OTA and a capacitor, a phase comparator for receiving the input signal to the phase shifter and the output signal of the phase shifter outputs a signal corresponding to a phase difference between the input signals, and an voltage is converted to a current by a voltage-to-current converter through an amplifier for amplifying the DC voltage of the output signal of the phase comparator. Control is performed so that by changing the transconductance (gm) of at least one OTA constituting the phase shifter, using the output current of the voltage-to-current converter, the phase difference given by the phase shifter becomes a constant value.

In the present invention, the phase shifter is constituted from an odd-order filter.

In the present invention, the amplifier may be constituted from a differential amplifier for differentially inputting the DC voltage and a reference voltage. In this case, the reference voltage is set to a voltage equal to or less than a half of a power supply voltage.

In the present invention, charging means for charging at least one capacitor constituting the loop filter may be included. The loop filter receives the output signal of the phase comparator and outputs the DC voltage, and the capacitor may be configured to be charged to a voltage substantially equal to the reference voltage.

Alternatively, in the present invention, a gm-C filter having an OTA controlled in common by the control signal from the PLL circuit is included. In the present invention, the capacitance value of the phase shifter is matched to a value substantially equal to the value of the capacitor used in the gm-C filter.

The meritorious effects of the present invention are summarized as follows.

A first effect of the present invention is to allow reduction of variations.

The reason for this is that a differential amplifier is employed within the loop of the PLL in the present invention.

A second effect of the present invention is to enable the loop of the PLL to be pulled in reliably.

The reason for this is that the reference voltage is set to be equal to or less than a half of the power supply voltage.

A third effect of the present invention is to enable a circuit size to become comparatively small.

The reason for this is that in the present invention, frequency comparison using a filter circuit and a PLL circuit is used in place of frequency comparison using a VCO circuit and the PLL circuit.

A fourth effect of the present invention is to allow reduction of the influence of parasitic capacitors.

The reason for this is that in the present invention, an odd-order gm-C filter is employed as the phase shifter of a control unit, and its capacitance value is matched to a value substantially equal to the value of the capacitor used in the gm-C filter in a unit to be controlled.

A fifth effect of the present invention is to permit variations of the amplitude level of the input AC signal.

The reason for this is that, in the present invention, the phase of the input AC signal is compared with the phase to be output through the odd-order gm-C filter A sixth effect of the present invention is to allow reduction of the time of locking.

The reason for this is that, in the present invention, the capacitor constituting the loop filter is charged to a predetermined voltage.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 26 is a table showing normalized values for elements of the RLC ladder LPF with the order of n (with and without an input resistance);

PREFERRED EMBODIMENTS OF THE INVENTION

Embodiments for carrying out the present invention will be described below. In the preferred embodiment of the present invention, a phase shifter (101), comprising a transconductance amplifier (OTA) and a capacitor, which receives an alternating current (AC) signal of a predetermined frequency as an input signal and outputs a signal obtained by shifting the input signal by a predetermined phase, a phase comparator (105, 106) for receiving an input signal (fREF) to the phase shifter (101) and the output signal from the phase shifter (101) and outputs a signal corresponding to a phase difference between the received signals, and an amplifier (108) for amplifying the DC voltage of the output signal of the phase comparator are provided. Then, a phase locked loop (PLL) that performs control so that, by changing a transconductance (gm) of at least one OTA constituting the phase shifter (101) with an output voltage VCON of the amplifier (108) used as a control signal, a phase difference in the phase shifter becomes constant is included. Preferably, the amplifier (108) is composed by a differential amplifier which differentially amplifies the difference voltage between the DC voltage of the output signal of the phase comparator and a reference voltage.

By using a control current (ICON) obtained by converting the control voltage from the amplifier (108) into a current, the transconductance (gm) of the at least one OTA constituting the phase shifter (101) may be changed.

In the present invention, the phase shifter (101) comprising the OTAs and the capacitor composes an odd-order filter such as a first-order filter, a third-order filter, or the like.

A frequency setting circuit according to the present invention includes a gm-C filter (102), which comprises an OTA controlled in common by the control signal VCON from the PLL circuit, for receiving an input signal Vin and outputting an output signal Vout.

Preferably, in the present invention, the phase shifter (101) shifts the phase by 45 degrees, for example, and the reference voltage for the amplifier (108) is set to be lower than a VDD/2 (such as a VDD/4). According to the present invention, a time required for attaining the VDD/4 becomes less than the time required for attaining the VDD/2 by a factor of two or more, so that a locking time is reduced to a half. Further, the phase shift of the PLL is reduced (with a maximum value thereof being in the range of ±45 degrees centering on 45 degrees), which creates a phase margin, so that the phase margin is secured. Specific embodiments will be described below.

EMBODIMENTS

Figure 1:
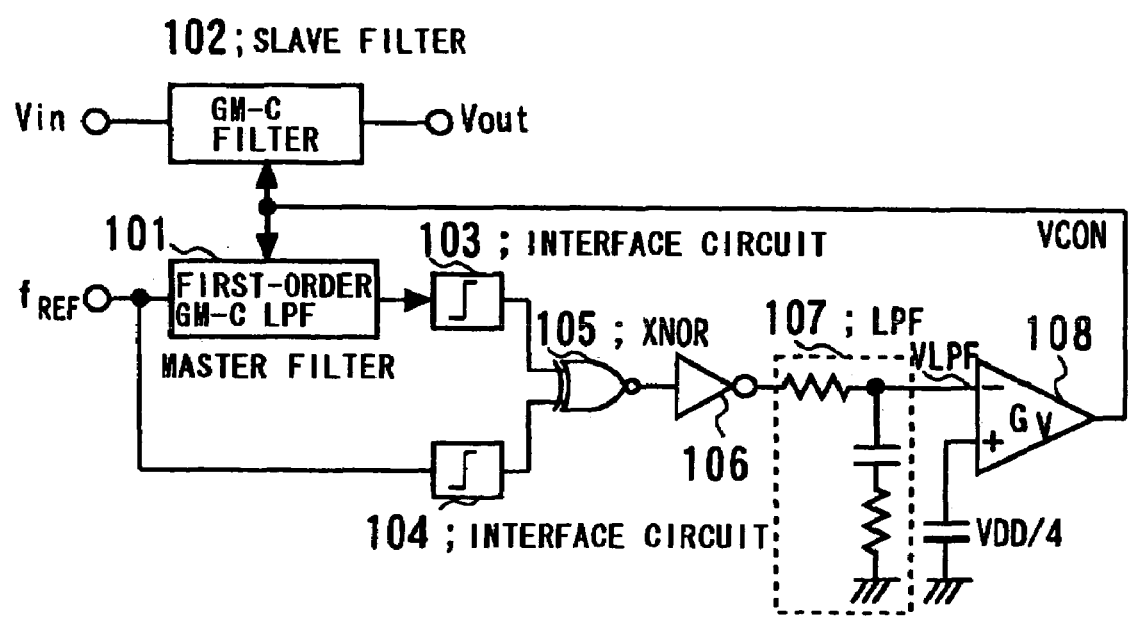
FIG. 1 is a diagram showing a configuration of a PLL circuit according to an embodiment of the present invention.

FIG. 1 is a circuit diagram showing an embodiment of a PLL circuit of the present invention. Referring to FIG. 1, one of an input AC signal with a reference frequency $f_{REF}$ is supplied to one of the input terminals of an XNOR circuit 105 constituting the phase comparator through the phase shifter 101 and an interface circuit 103. The phase shifter 101 comprises an OTA and a capacitor. The other of the input AC signal of the reference frequency $f_{REF}$ is supplied to the other input terminal of the XNOR circuit 105 constituting the phase comparator through an interface circuit 104. Herein, the phase shifter 101 is constituted from a first-order gm-C low-pass filter (LPF), and is also referred to as a master filter. The interface circuits 103 and 104 respectively convert the AC signal to a logic signal (a rectangular wave).

Figure 2:
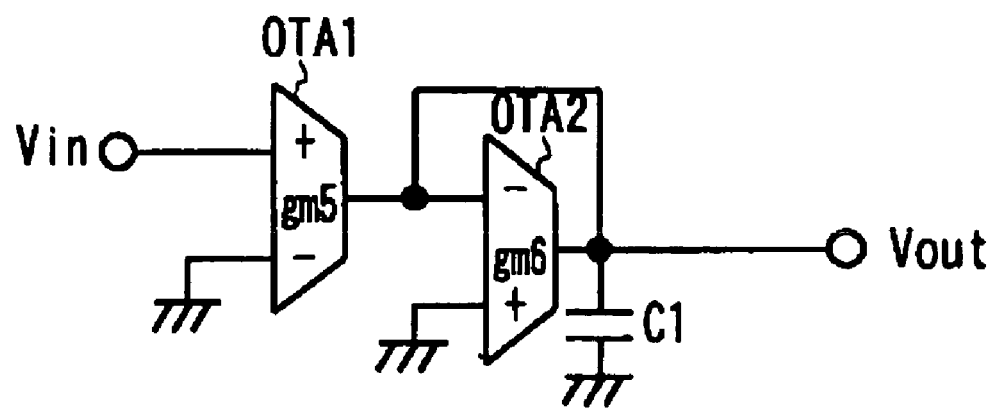
FIG. 2 is a diagram showing a configuration of a single-ended first-order gm-C LPF used in a phase shifter of the diagram showing the PLL circuit of the present invention.

A single-ended first-order gm-C LPF constituting the phase shifter 101 is configured as shown in FIG. 2. An OTA1 (with a conductance gm5) having a non-inverting input terminal (+) thereof connected to an input terminal and an inverting input terminal (−) connected to a ground potential, and an OTA2 (with a conductance gm6) having a non-inverting input terminal (+) thereof connected to the ground potential and an inverting input terminal (−) thereof connected to the connection node between the output of the OTA1 and an output terminal Vout are included. A capacitor C1 is connected to an output Vout of the OTA2 and a ground.

The transfer characteristic (function) of the first-order gm-C LPF in FIG. 2, is expressed as follows:

$$T_1(s) = \frac{V_{out}}{V_{in}} = \frac{\frac{g_{m6}}{C_1}}{s + \frac{g_{m6}}{C_1}} \quad (7)$$

If $gm_5=gm_6=gm$ holds, for simplicity, $\omega_0$ becomes equal to $gm/C_1$, and the transfer characteristic (function) of the first-order gm-C LPF can be expressed as follows:

$$T_1(j\omega) = \frac{V_{out}}{V_{in}} = \frac{1}{1+j\frac{\omega}{\omega_0}} \quad (8)$$

Figure 3:
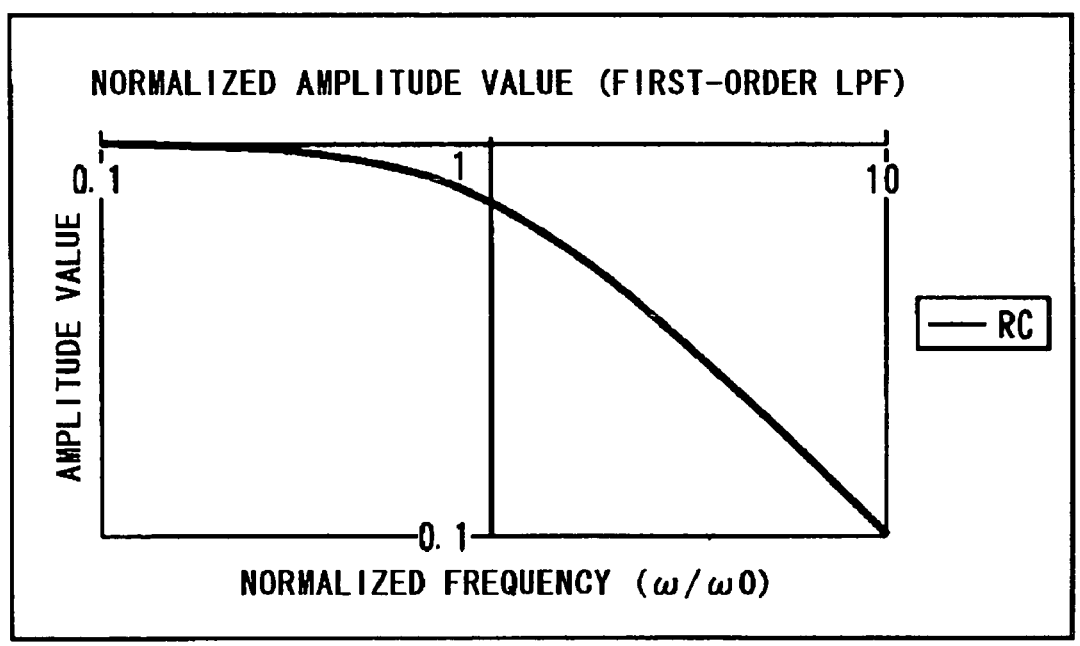
FIG. 3 is a graph showing an amplitude characteristic of the first-order gm-C LPF.
Figure 4:
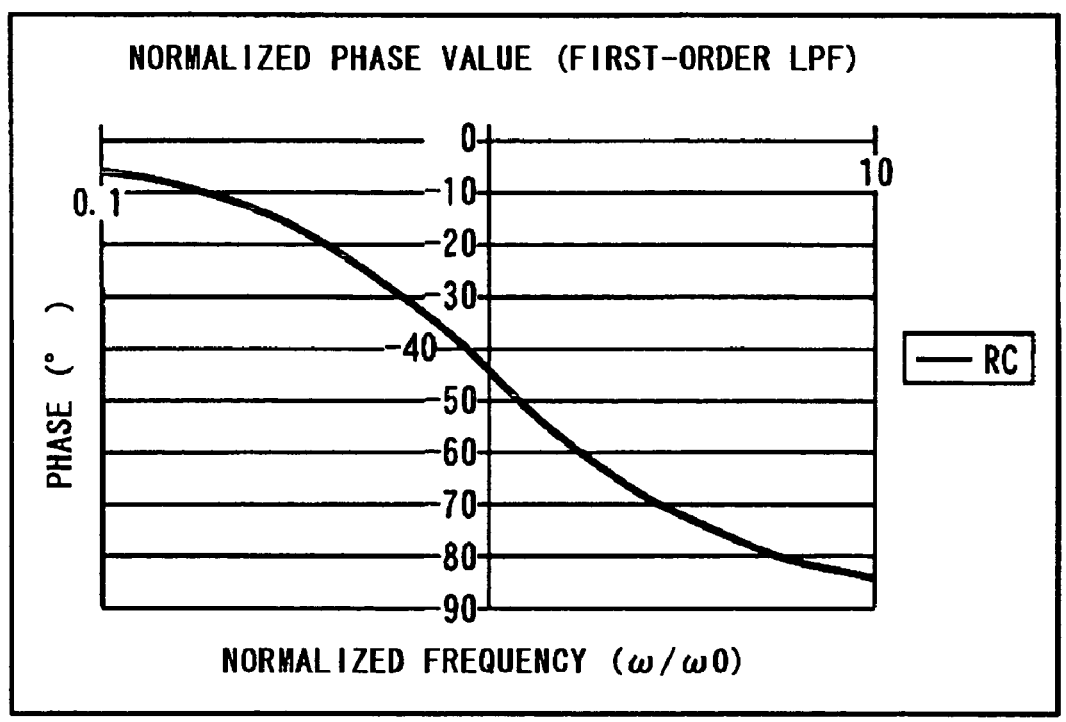
FIG. 4 is a graph showing a phase characteristic of the first-order gm-C LPF.

Accordingly, the amplitude characteristic of the first-order gm-C LPF becomes as shown in FIG. 3, while the phase characteristic of the first-order gm-C LPF becomes as shown in FIG. 4. That is, as is well known, the amplitude is attenuated at −6 dB/Oct, while the phase changes from 0 degrees to −90 degrees. At the cutoff frequency, the amplitude becomes −3.01 dB (=1/√2=0.7071), and the phase is delayed by just 45 degrees (π/4). Accordingly, −45 degrees at which the phase change at the phase shifter 101 is great is set as the phase amount.

Now, it is assumed that the phase comparator 105 outputs a signal corresponding to the phase difference between the two input signals of the phase comparator 105. Specifically, when the phase comparator 105 outputs the product of the two input signals, a multiplier other than the XNOR circuit or XOR circuit, which is a simple digital circuit as shown in FIG. 1, may also be used as described in connection with a prior art.

The output signal of the phase comparator (XNOR circuit) 105 has such a waveform as a rectangular wave that assumes the power supply voltage VDD and a GND voltage, and its DC voltage is proportional to the phase difference between the two input signals.

In FIG. 1, in order to make a phase sift through a loop filter 107 to be less than 90 degrees and to secure the phase margin, a lag-lead filter is employed.

Accordingly, since the phase difference through the phase shifter 101 is 45 degrees (π/4), the DC voltage can be expected to be VDD/4. Thus, the reference voltage applied to the non-inverting terminal (+) of the differential amplifier 108 arranged in the succeeding stage is set to the VDD/4.

Figure 28:
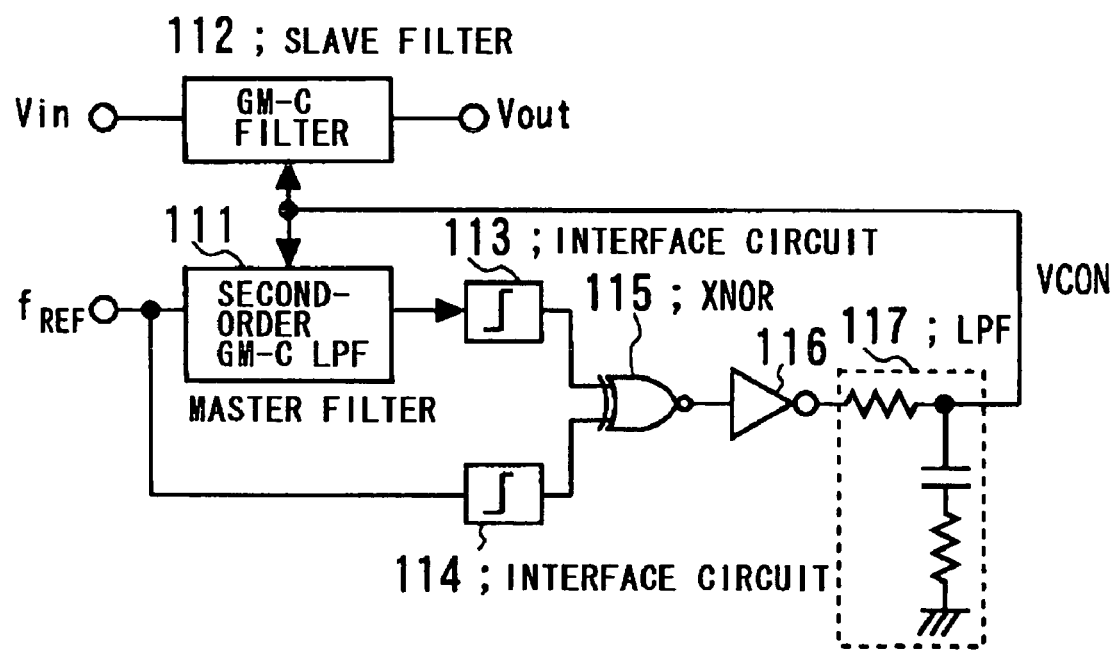
FIG. 28 is a diagram showing a configuration of a conventional PLL circuit.

In the conventional PLL circuit of this type, shown in FIG. 28, the reference voltage is set to the VDD/2. In the present invention, on the other hand, the reference voltage is set to be lower than the VDD/2.

Figure 29:
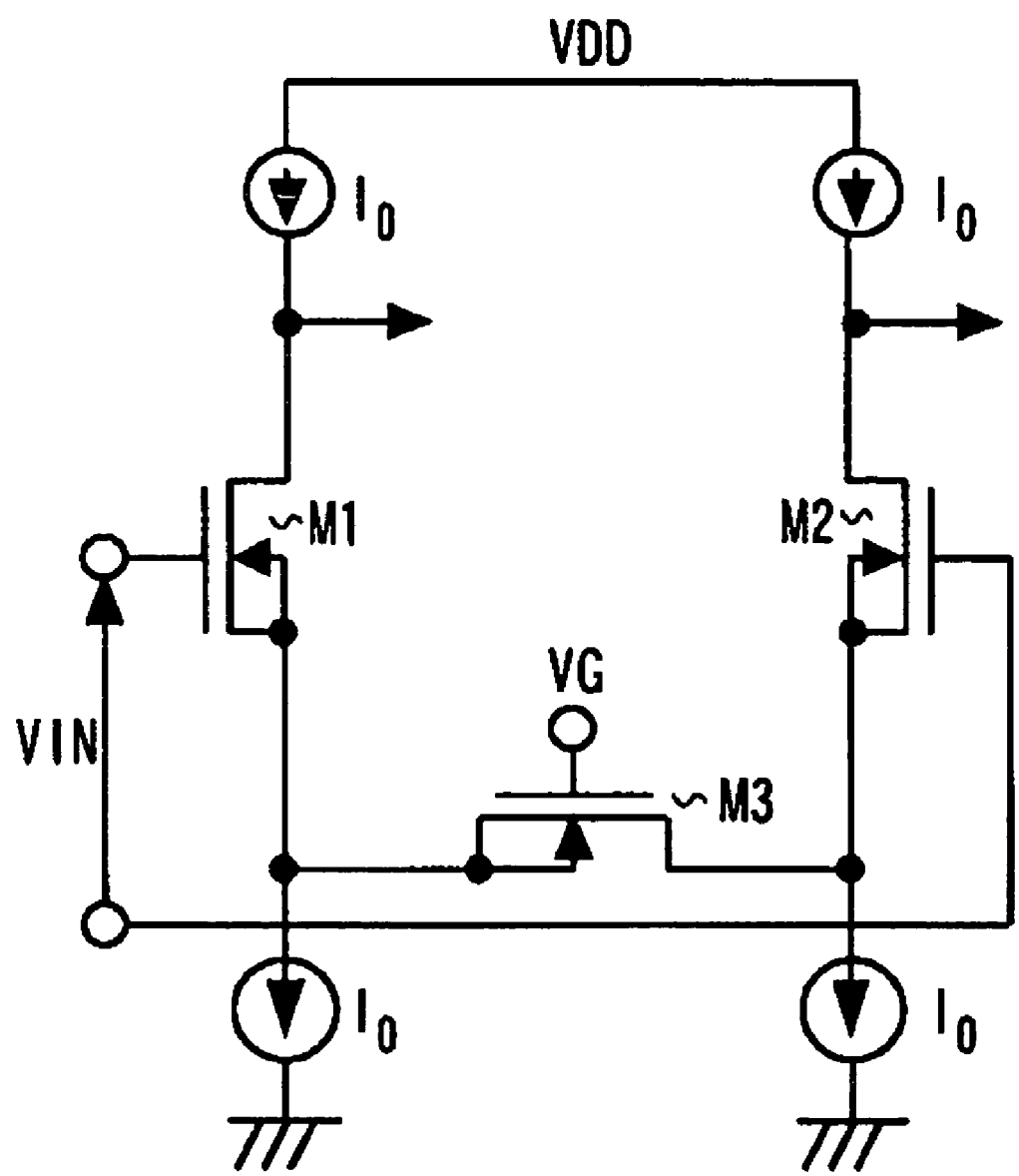
FIG. 29 is a diagram showing an example of an OTA circuit.
Figure 30:
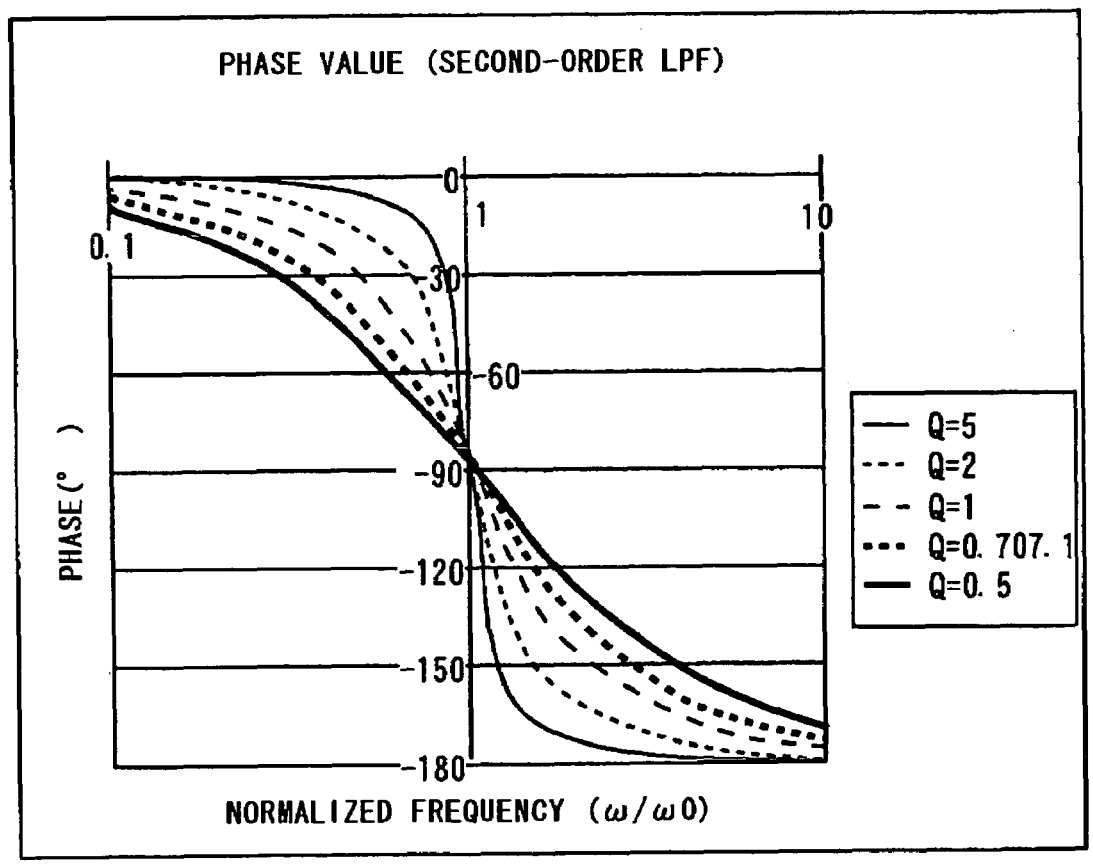
FIG. 30 is a graph showing an amplitude characteristic of a second-order LPF.
Figure 31:
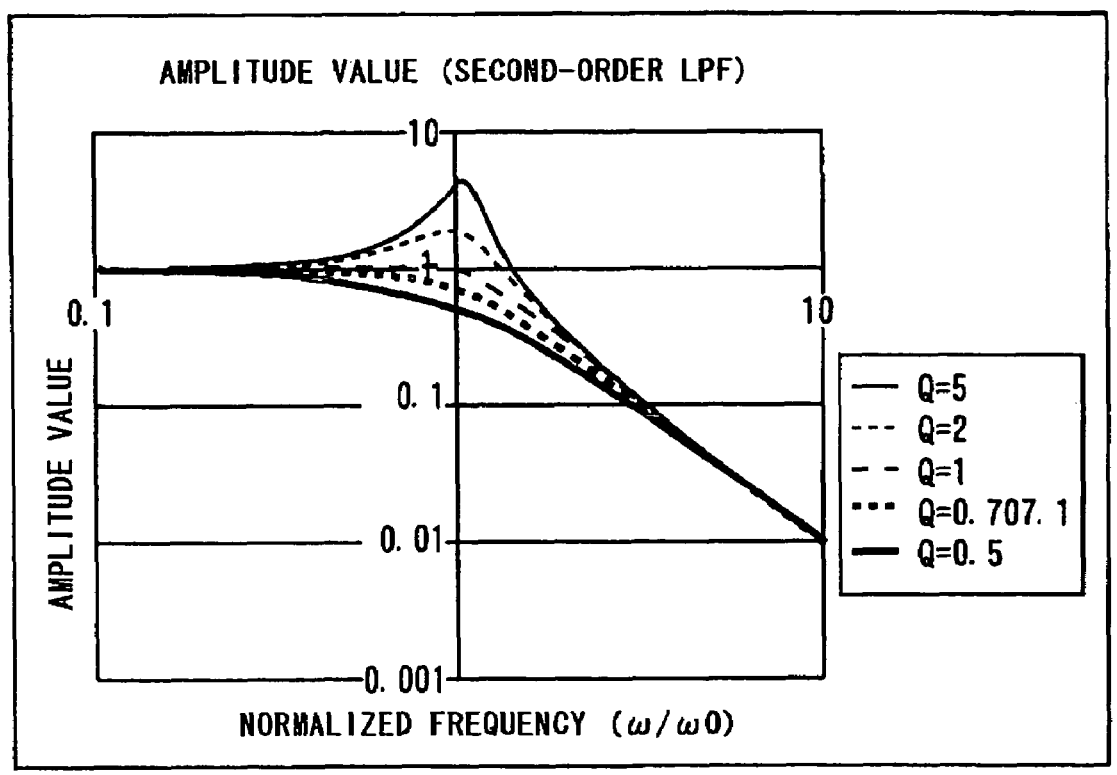
FIG. 31 is a graph showing a phase characteristic of the second-order LPF.
Figure 32:
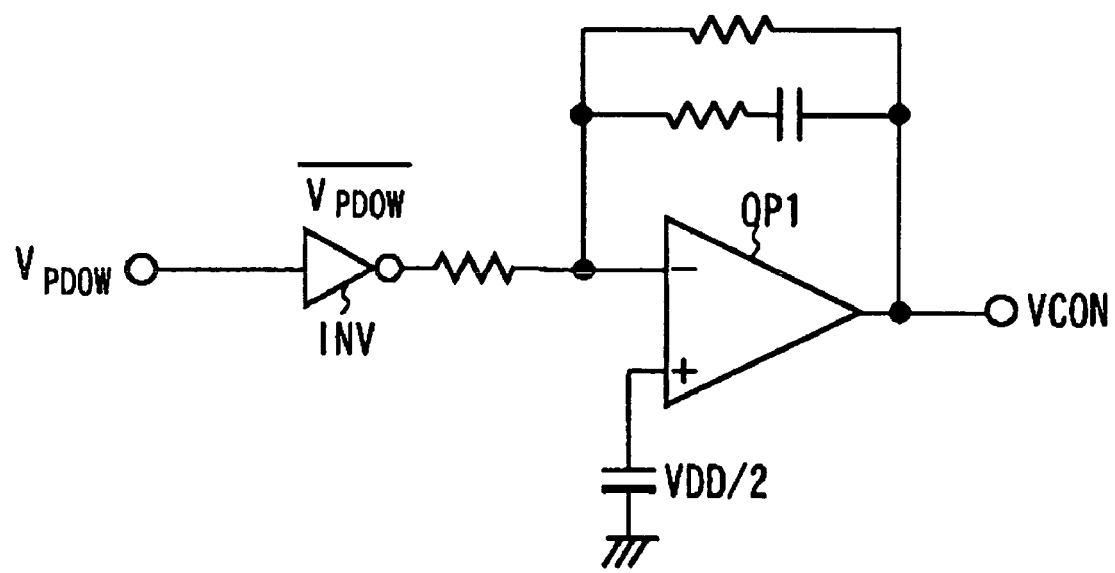
FIG. 32 is a diagram showing a circuit configuration of a conventional active PI (proportional+integral) loop filter.
Figure 33:
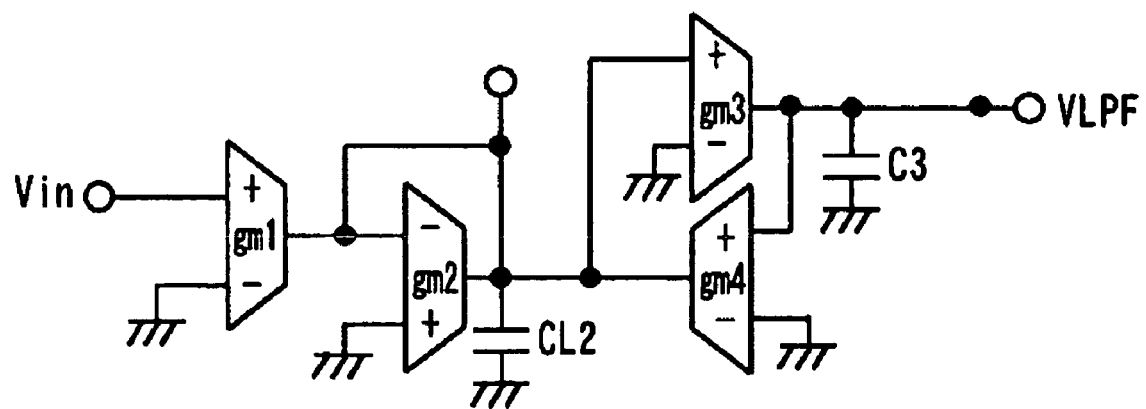
FIG. 33 is a diagram showing a circuit configuration of a single-ended second-order gm-C filter.

The reason why the reference voltage must be set to be lower than the VDD/2 can be explained as follows. That is, an OTA circuit controlled in the differential amplifier in the succeeding stage is the OTA circuit as described in connection with the prior art (refer to FIG. 29). Assume a case where a transistor (M3) that operates in a linear operating region is employed in place of a source-degeneration resistance for a differential pair (M1, M2), and that the transistor (M3) which operates in the linear operating region is controlled by adjusting the gate voltage thereof, and by changing the value of the degeneration resistance equivalently, the gm (transconductance) value of the OTA circuit is set. Then, manufacturing variations and a temperature variation of this transistor (M3) are present. Thus, it becomes necessary to make characteristic variations of this transistor M3 not to be appreciable. Then, by setting a voltage gain $G_v$ of the differential amplifier in the preceding stage to be large (e.g. 100 times larger), it can be expected that the influence in the succeeding stage can be compressed to $1/G_v$.

When the voltage gain $G_v$ of the differential amplifier is set to be large (e.g. 100 times larger), an operating input voltage range is compressed to $VDD/G_v$. For this reason, unless an output DC voltage VLPF of the loop filter (LPF) 107 is raised to a value in the vicinity of the set reference voltage, the loop is not pulled in.

However, for some time after power-on, the following relation holds:

$VLPF < VDD/4 - VDD/(2G_v)$

Thus, the output voltage VCON of the differential amplifier 108 remains at the GND voltage. Accordingly, the value of the source-degeneration resistance becomes infinity, the gm value becomes a minimum value (being equal to zero), and the output of the phase shifter 101 also becomes fixed. That is, the output of a phase detector becomes a rectangular wave of the AC signal with a frequency $f_{REF}$ without alteration, with a duty of 50%.

Accordingly, the output DC voltage VLPF of the loop filter (LPF) gradually rises according to a preset time constant, and finally goes up to the VDD/2.

In FIG. 1, the reference voltage input to the differential amplifier 108 is set to approximately a half of the DC voltage value obtained by rectifying the rectangular wave with the duty of 50%. Thus, even if the voltage gain $G_v$ of the differential amplifier 108 is set to be large, crossing of the output DC voltage VLPF of the loop filter (LPF) 107 through the reference voltage VDD/4 for the differential amplifier 108 is ensured. The loop of the PLL is thereby pulled in.

Figure 27:
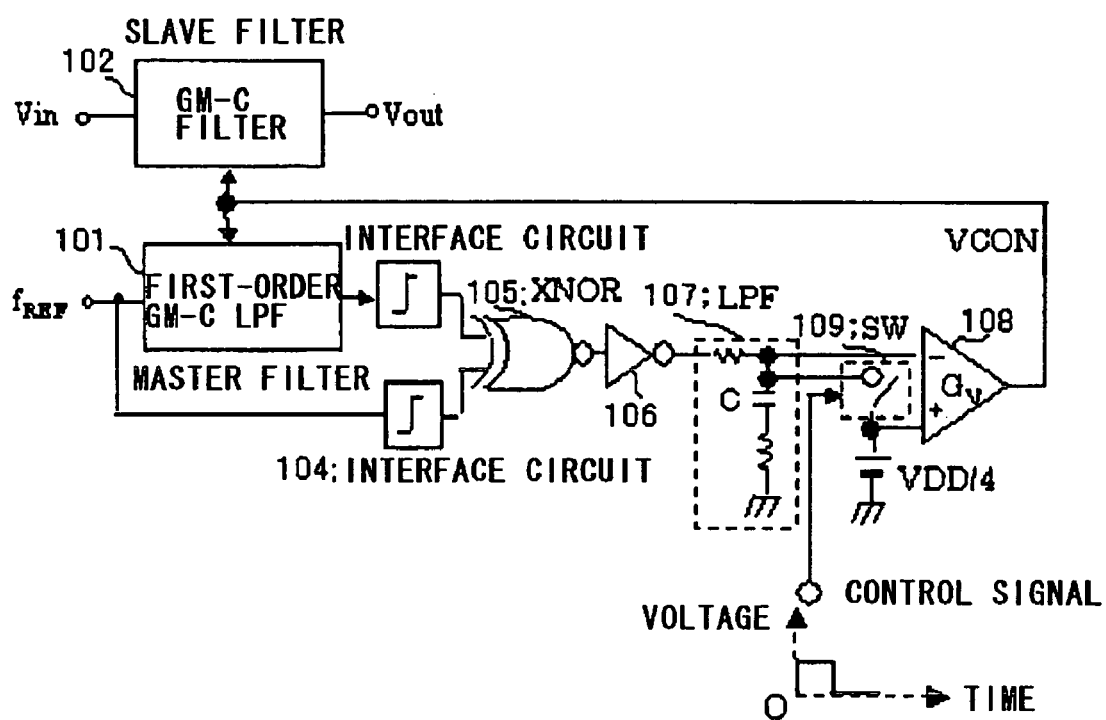
FIG. 27 is a diagram showing a configuration of a PLL circuit according to a variation of the embodiment of the present invention.

In view of this, it is found that unless the output DC voltage VLPF of the loop filter (LPF) 107 is within the range of the reference voltage $VDD/4 \pm VDD/G_v$ for the differential amplifier 108, the loop is not pulled in. Thus, by charging in advance the capacitor constituting the loop filter (LPF) 107 to $VDD/4 \pm VDD/G_v$ so that the output DC voltage VLPF of the loop filter (LPF) 107 is in a short time within the range of $VDD/4 \pm VDD/G_v$, where the VDD/4 is the reference voltage supplied to the differential amplifier 108, the time of locking can be greatly reduced. When the power supply voltage VDD is set to 3.3V and the gain $G_v$ is set to 100, for example, the $VDD/G_v$ becomes 0.33V (=33 mV). Thus, the charging to a voltage substantially equal to the reference voltage VDD/4 should be performed. That is, the charging can be performed by using the reference voltage. The time of the locking according to the present invention is two or more times shorter than the time of locking when a conventional active PI loop filter using the VDD/2 as the reference voltage, even if the charging of the capacitor constituting the loop filter (LPF) 107 described above is not performed. However, by charging the capacitor constituting the loop filter (LPF) 107 as described above, order-of-magnitude reduction of the time of the locking can be achieved, in particular. Actually, when the conventional active PI loop filter using the VDD/2 as the reference voltage is employed, the DC component of the output voltage of the loop filter smoothly increases as the output DC voltage gets closer to the VDD/2. Thus, compared with the case where the reference voltage is set to the VDD/4, the time of the locking that is several times longer than the one using the VDD/4 as the reference voltage is required. At worst, the time of the locking using the active PI loop filter with the VDD/2 used as the reference voltage can be even infinity, theoretically. It means that it is never reasonable to set the reference voltage to the VDD/2. If anything, in a VCF (voltage-controlled filter) system, the reference voltage of the active PI loop filter should not be set to the VDD/2, but should be set to be no more than the VDD/2. FIG. 27 is a diagram showing an example of a configuration according to an embodiment including a switch (SW) 109 for performing control so that the capacitor of the loop filter 107 is charged to the reference voltage VDD/4. The switch (SW) 109 is inserted between one terminal of a capacitor C of the loop filter (LPF) 107 (with the other terminal of the capacitor C connected to the ground potential through a resistance) and the reference voltage VDD/4, and is controlled to be switched on and off by a control signal. When the control signal is set to be active (such as to a high level, for example), the switch (SW) 109 is turned on, and the capacitor C of the loop filter (LPF) 107 is charged to the reference voltage VDD/4 in advance. Then, the control signal is set to be inactive (at a low level, for example), so that the switch (SW) 109 is turned off.

In case that the active PI (proportional+integral) loop filter that uses an OP amplifier as the loop filter (LPF) described as the conventional technique is used so as to increase the gain of the loop and that the voltage of the VDD/2 is applied to a plus terminal, the PLL loop is not pulled in if the gain of the active PI loop filter is increased.

Figure 5:
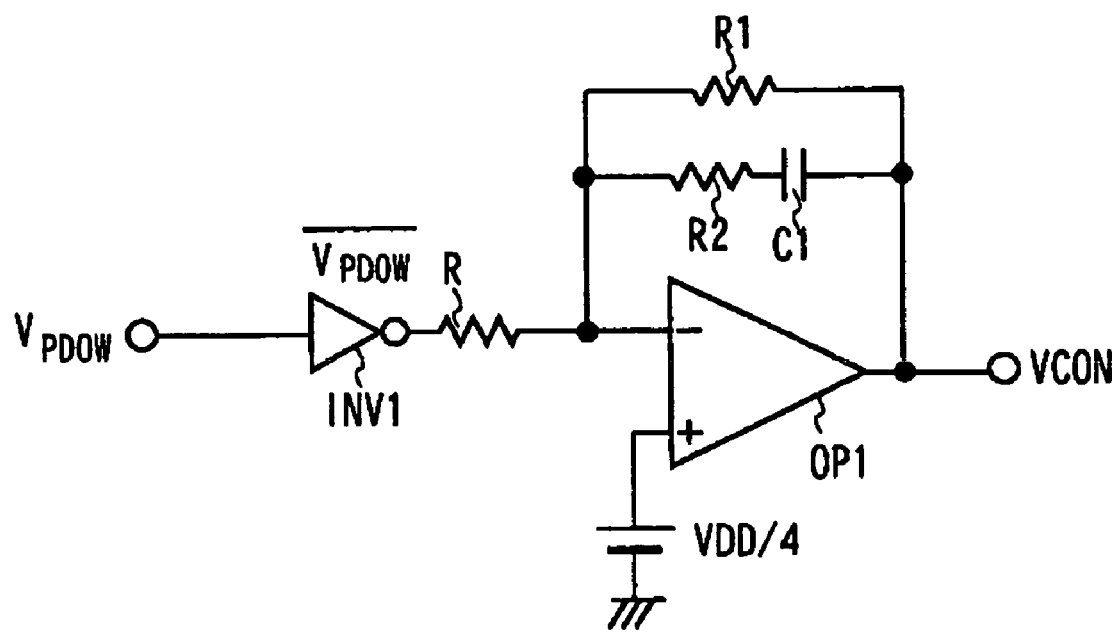
FIG. 5 is a diagram showing a circuit configuration of an active PI (proportional+integral) loop filter of the present invention.

Accordingly, in the PLL circuit of the present invention, though the loop filter (LPF) 107 and the differential amplifier 108 in the next stage can be combined to be changed to an active PI (proportional+integral) loop filter as shown in FIG. 5, the reference voltage VDD/4 is applied to the plus terminal. Thus, even if the voltage gain of the active PI loop filter is increased, pulling in of the loop of the PLL is ensured.

In both cases of the PLL circuit where the conventional active PI loop filter is employed and the PLL circuit where a passive loop filter (LPF) is employed, a phase difference is generated. However, there are not many cases where it is disadvantageous that the phase difference is not 90 degrees (π/2).

If the generated phase difference does not cause a problem, the manner of the present invention in which the PLL loop is pulled in by a voltage lower than the VDD/2 is more advantageous than the conventional PLL circuit. It is because, obviously, reduction of the time for attaining the operating voltage required for the PLL loop to be pulled in is ensured even if the time constants of the loop filters are the same.

Figure 6:
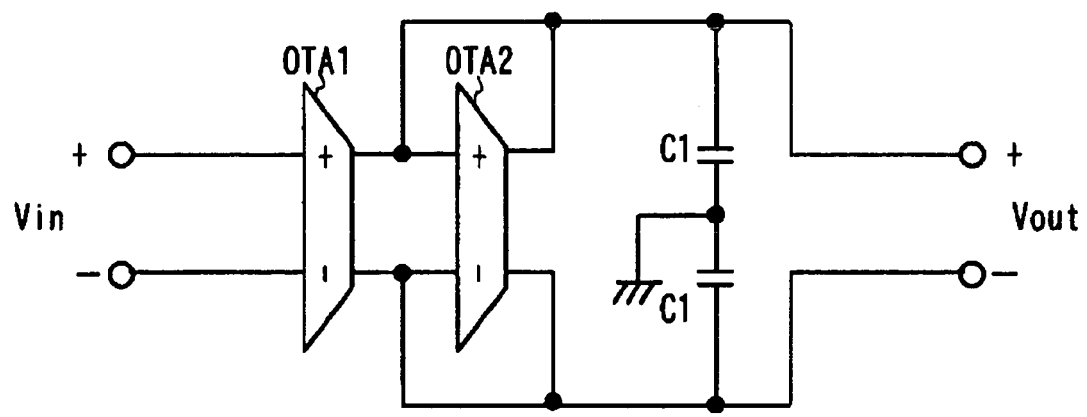
FIG. 6 is a diagram showing a circuit configuration of the first-order gm-C LPF of a fully differential type.

Generally, when the OTA circuit is used as a single-ended circuit, a second-order distortion thereof increases. Accordingly, the single-ended first-order gm-C LPF shown in FIG. 2 can be changed to the one of a fully differential type in FIG. 6. As shown in FIG. 6, the OTA1 differentially receives the input voltage Vin from the non-inverting input terminal (+) thereof and the inverting input terminal (−) thereof. In the OTA2, the connection node between the non-inverting output terminal thereof and the non-inverting output terminal of the OTA1 is connected to the non-inverting input terminal (+) thereof. The connection node between the inverting output terminal thereof and the inverting output terminal of the OTA1 is connected to the inverting input terminal (−) thereof. The inverting and non-inverting output terminals of the OTA2 are grounded through the capacitors C1, respectively.

In the case of a configuration shown in FIG. 6, the gm value of the OTA circuit equivalently becomes twice as many as that of the circuit in FIG. 2. That is, the gm value in Equation (7) should be doubled.

In the detailed description of the invention described above, the case where the first-order gm-C LPF is used as the phase shifter was taken up. However, as a 45-degree phase shifter, the phase shifter that uses a first-order gm-C HPF (High Pass Filter) can be conceived.

Figure 7:
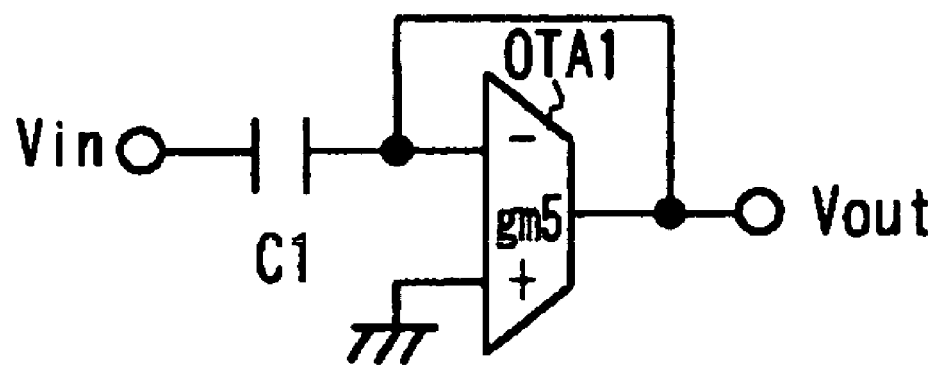
FIG. 7 is a diagram showing a circuit configuration of a single-ended first-order gm-C HPF used in the phase shifter in the diagram showing the PLL circuit of the present invention.

FIG. 7 shows a single-ended first-order gm-C HPF. The transfer characteristic (function) thereof becomes as follows:

$$T_1(s) = \frac{V_{out}}{V_{in}} = \frac{s}{s + \frac{g_{m5}}{C_1}} \quad (9)$$

in which $\omega_0$ becomes equal to $g_{m5}/C_1$, so that the transfer characteristic (function) can be expressed as follows:

$$T_1(j\omega) = \frac{V_{out}}{V_{in}} = \frac{j\frac{\omega}{\omega_0}}{1 + j\frac{\omega}{\omega_0}} \quad (10)$$

Figure 8:
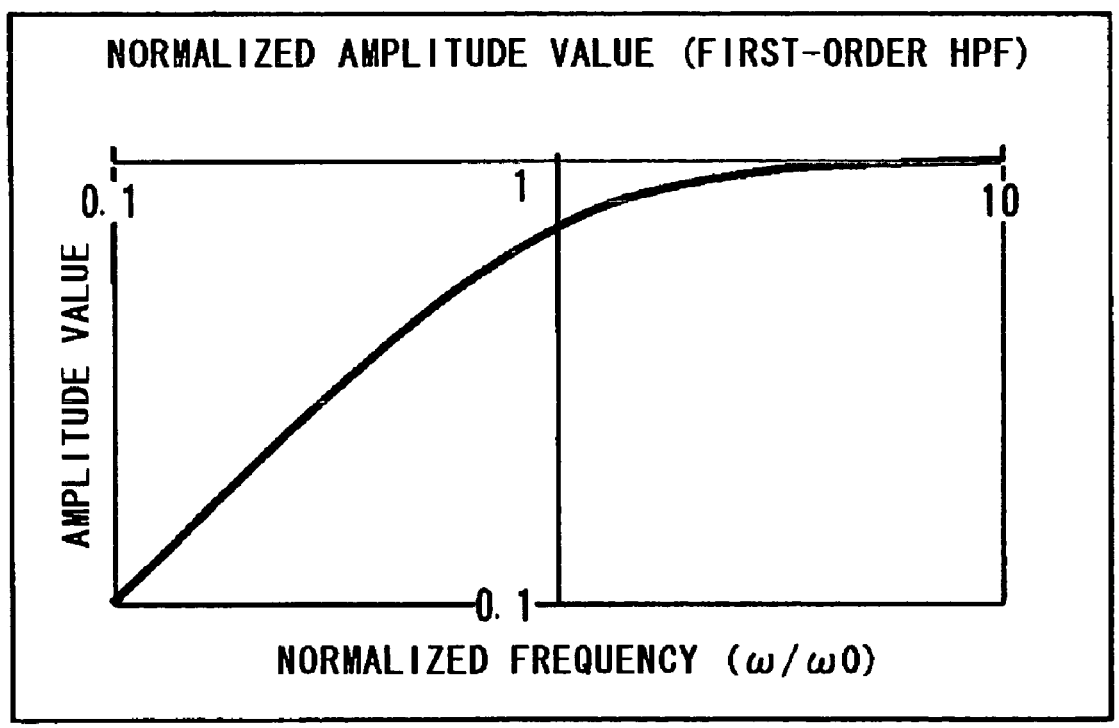
FIG. 8 is a graph showing an amplitude characteristic of the first-order gm-C HPF.
Figure 9:
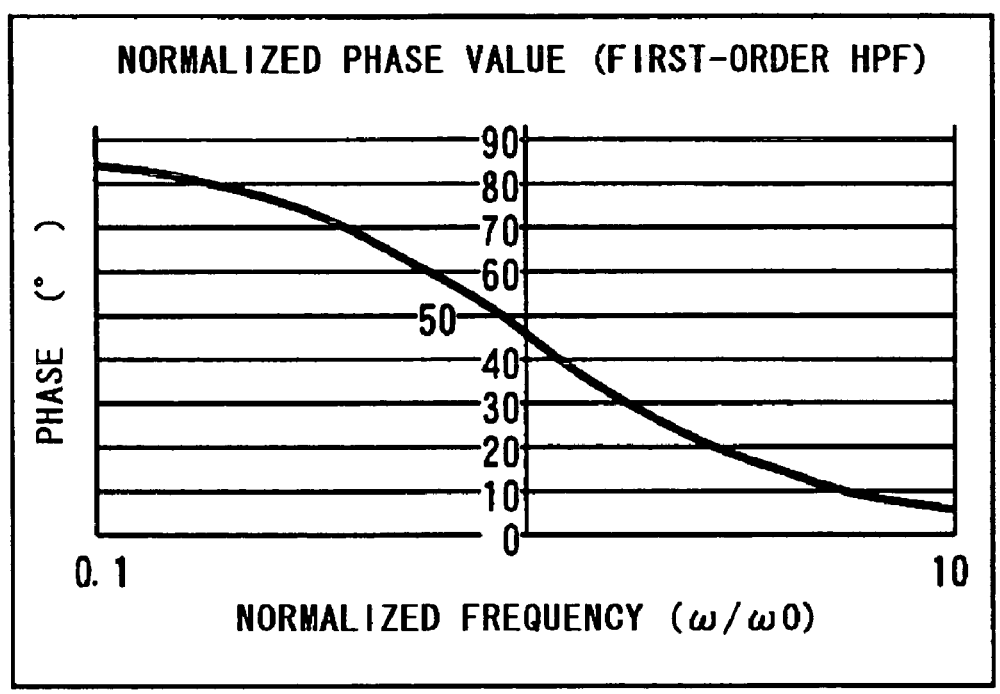
FIG. 9 is a graph showing a phase characteristic of the first-order gm-C HPF.

Accordingly, the amplitude characteristic becomes as shown in FIG. 8, while the phase characteristic becomes as shown in FIG. 9. That is, as is well known, the amplitude increases at 6 dB/Oct, while the phase changes from 90 degrees to zero degrees.

At the cutoff frequency, the amplitude becomes −3.01 dB ($=1/\sqrt{2}=0.7071$) with respect to the amplitude value at the time of a frequency of ∞, and the phase is advanced by just 45 degrees ($\pi/4$).

Accordingly, 45 degrees at which the phase change in the phase shifter is great is set to the phase amount.

Figure 10:
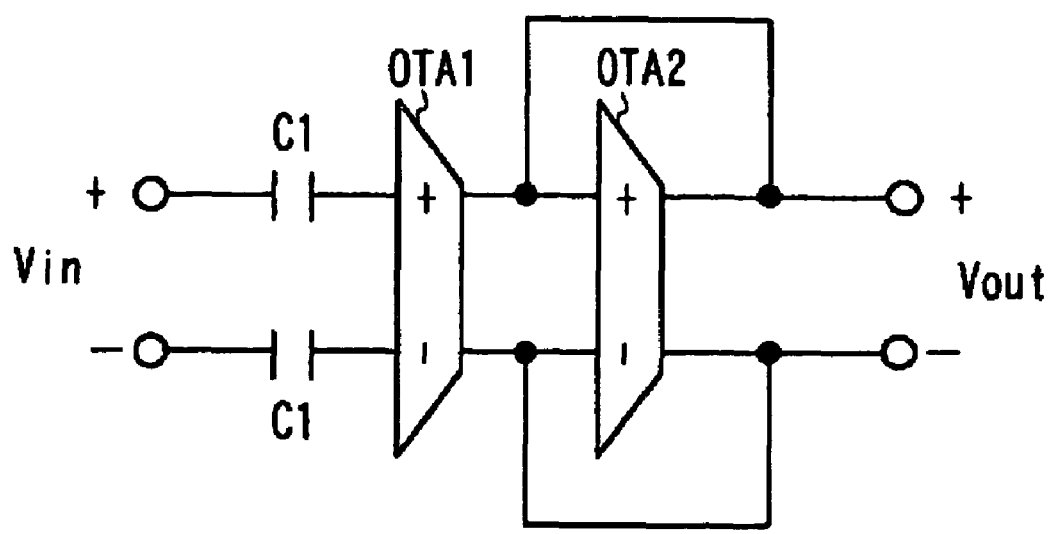
FIG. 10 is a diagram showing a circuit configuration of the first-order gm-C HPF of the fully-differential type.

Generally, when the OTA circuit is used as the single-ended circuit, the second-order distortion thereof increases. Thus, the single-ended first-order gm-C HPF shown in FIG. 7 can be likewise changed to the one of the fully differential type as shown in FIG. 10. In this case, the gm value of the OTA circuit equivalently becomes twice as many as that of the circuit in FIG. 7. That is, the gm value in Equation (9) should be doubled.

The above description was directed to the case where the first-order filter is used as the phase shifter 101. As described in detail, the phase detector has only the function of detecting a phase difference between two input signals, so that the phase detector cannot determine whether there is a phase delay or a phase advance. Accordingly, a higher-order filter can also be used as the phase shifter 101. Next description will be directed to this.

In a standardized third-order Butterworth LPF having an input resistance (1 Ω) and a terminating resistance (1 Ω), for example, C1 becomes 1F, L2 becomes 2H, and C3 becomes 1F. Then, the transfer characteristic (function) thereof becomes as follows:

$$H(s) = \frac{V_{out}}{V_{in}} = \frac{1}{2} \frac{1}{s^3 + 2s^2 + 2s + 1} \quad (11)$$

Then, the normalized angular frequency ω thereof is expressed as follows:

$$H(j\omega) = \frac{V_{out}}{V_{in}} = \frac{1}{2} \frac{1}{-j\left(\frac{\omega}{\omega_0}\right)^3 - 2\left(\frac{\omega}{\omega_0}\right)^2 + 2j\left(\frac{\omega}{\omega_0}\right) + 1} \quad (12)$$

Figure 11:
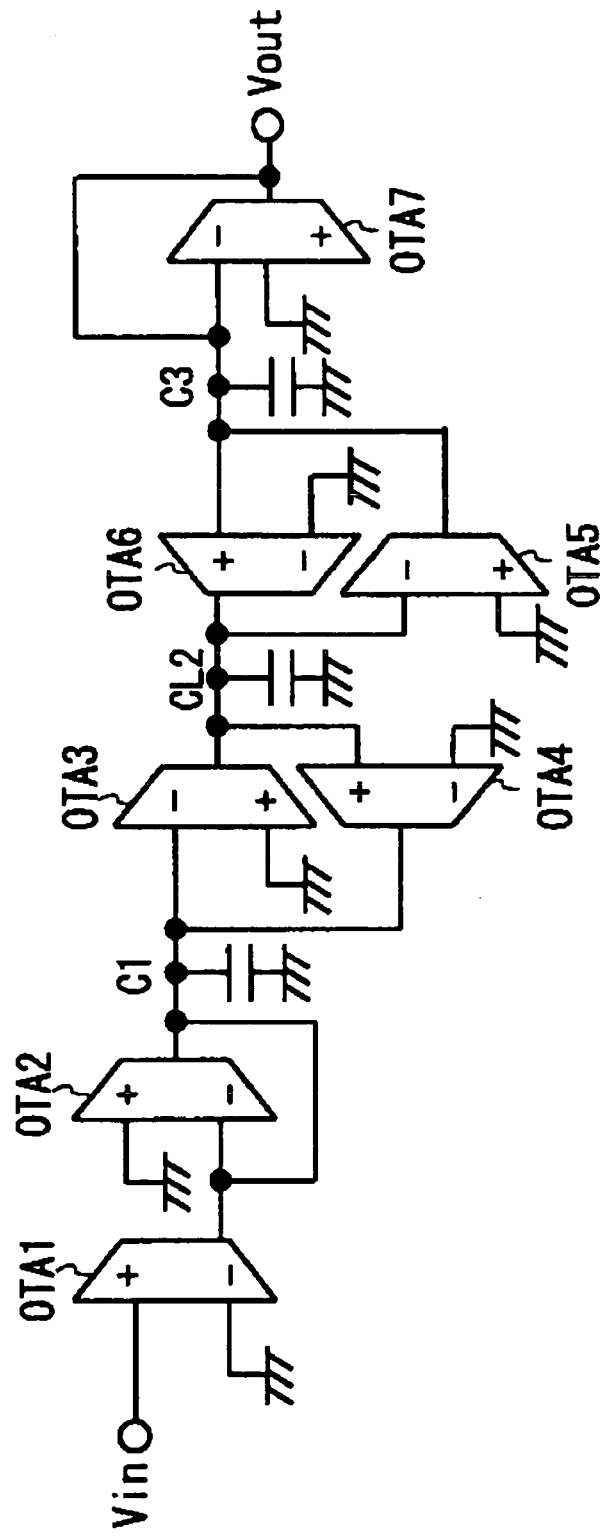
FIG. 11 is a diagram showing a single-ended third-order gm-C LPF used in the phase shifter in the diagram showing the PLL circuit of the present invention.
Figure 12:
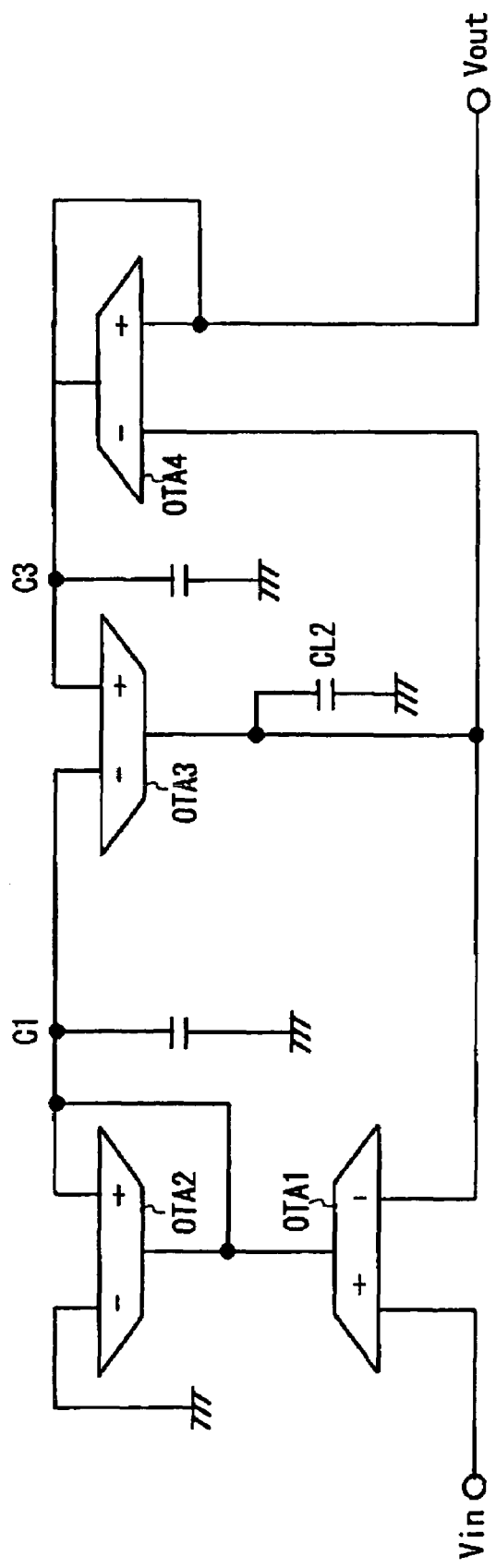
FIG. 12 is a diagram showing a diagram showing a circuit configuration of other single-ended third-order gm-C LPF used in the phase shifter in the diagram showing the PLL circuit of the present invention.

Two types of methods of implementing a floating inductance L have been known, so that single-ended third-order Butterworth gm-C LPFs (Low Pass Filters) shown in FIGS. 11 and 12 can be derived. A configuration shown in FIG. 11 includes the OTA1, the OTA2, an OTA3, an OTA4, an OTA5, an OTA6, and an OTA7. The input voltage Vin is input to the non-inverting input terminal (+) of the OTA1, and the inverting input terminal (−) of the OTA1 is connected to the ground potential. The non-inverting input terminal (+) of the OTA2 is connected to the ground potential, and the common connection node between the output of the OTA1 and the output of the OTA2 is connected to the inverting input terminal (−) of the OTA2. The connection node between the output of the OTA2 and the capacitor C1 is connected to the inverting input terminal (−) of the OTA3, and the inverting input terminal (+) of the OTA3 is connected to the ground potential. The connection node between the output of the OTA3 and a capacitor CL2 is connected to the noninverting input terminal (+) of the OTA4, the inverting input terminal (−) of the OTA4 is connected to the ground potential, and the output of the OTA4 is connected to the terminal of the capacitor C1. The connection node between the output of the OTA3 and the capacitor CL2 is connected to the inverting input terminal (−) of the OTA5, and the non-inverting input terminal (+) of the OTA5 is connected to the ground potential. The connection node between the output of the OTA5 and a capacitor C3 is connected to the non-inverting input terminal (+) of the OTA6, the inverting input terminal (−) of the OTA6 is connected to the ground potential, and the output of the OTA6 is connected to the terminal of the capacitor CL2. The non-inverting input terminal (+) of the OTA7 is connected to the ground potential, the common connection node among the output of the OTA5, capacitor C3, and the output terminal Vout is connected to the inverting input terminal (−) of the OTA7, and the inverting input terminal (−) of the OTA7 is connected to the ground potential. A configuration in FIG. 12 includes the OTA1 with the input voltage Vin input to the non-inverting input terminal there of (+) and the OTA2 with the inverting input terminal thereof connected to the ground potential. The outputs of the OTA1 and the OTA2 are connected in common to the non-inverting input terminal (+) of the OTA2, grounded through the capacitor C1, and are connected to the non-inverting input terminal (−) of the OTA3. The output of the OTA3 is connected to the inverting input terminals (−) of the OTA1 and the OTA4. The output of the OTA4 is feedback connected to the non-inverting input terminal (+) of the OTA4, and is also connected to the non-inverting input terminal (+) of the OTA3. The outputs of the OTA3 and the OTA4 are grounded through the capacitors CL2 and C3, respectively.

Figure 13:
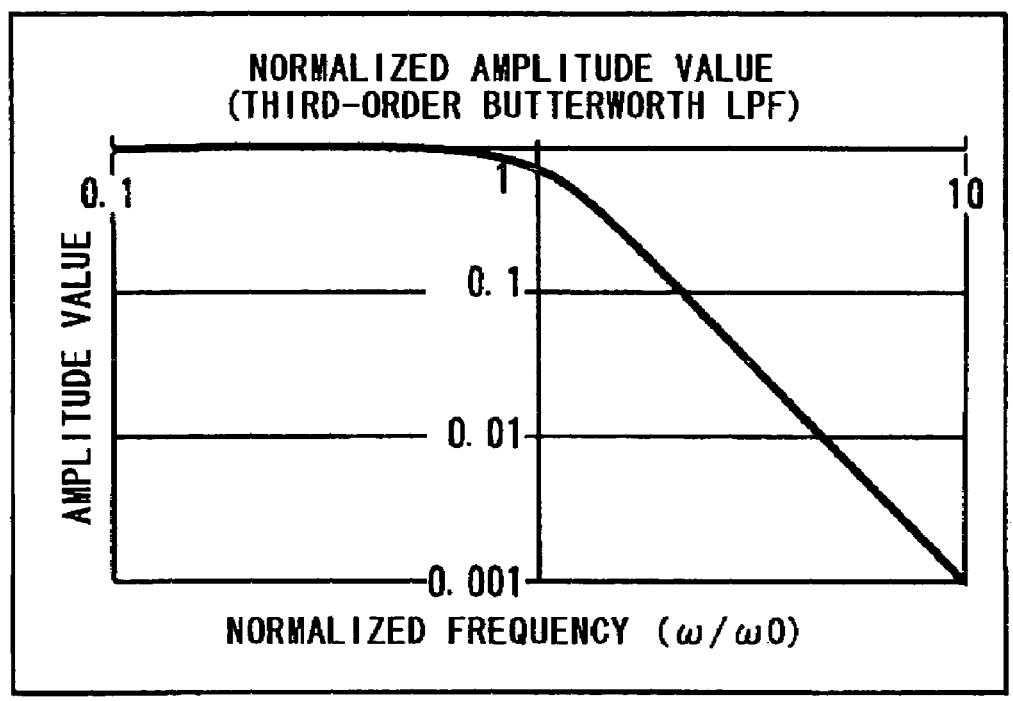
FIG. 13 is a graph showing an amplitude characteristic of the third-order gm-C LPF.
Figure 14:
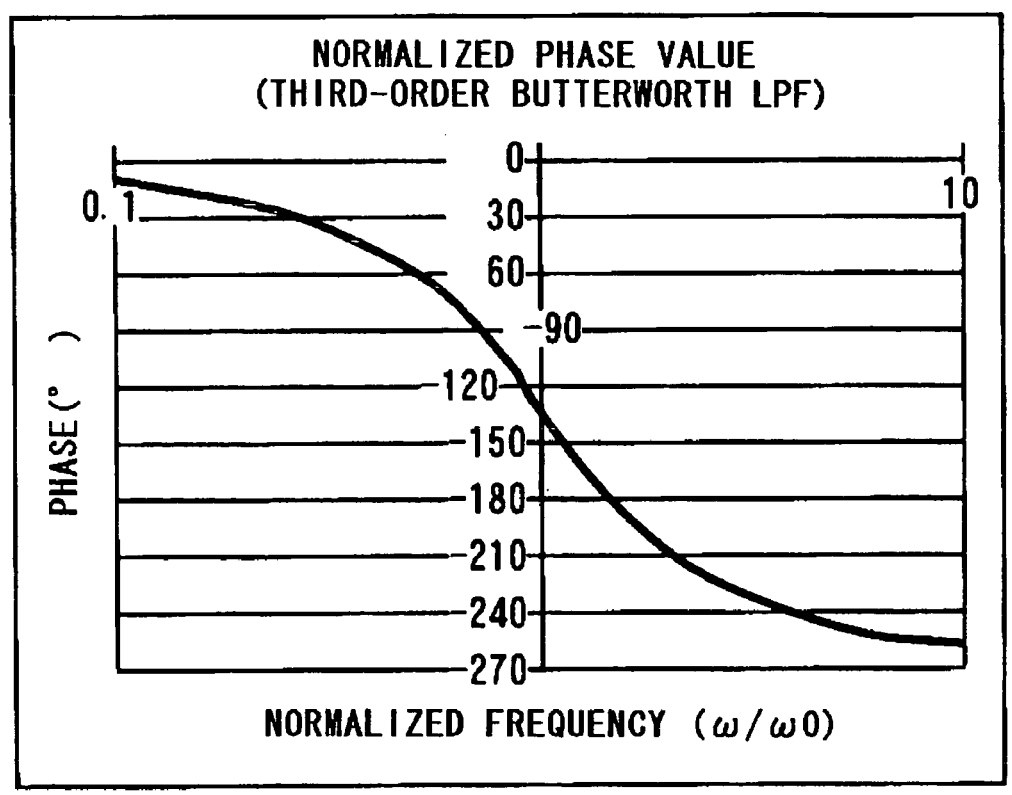
FIG. 14 is a graph showing a phase characteristic of the third-order gm-C LPF.

Accordingly, the amplitude characteristic becomes as shown in FIG. 13, while the phase characteristic becomes as shown in FIG. 14. That is, as is well known, the amplitude is attenuated at −18 dB/Oct, while the phase changes from zero degrees to −270 degrees. At the cutoff frequency, the amplitude becomes −3.01 dB (=1/$\sqrt{2}$=0.7071), and the phase is delayed by just 135 degrees (3π/4). Accordingly, 135 degrees at which the phase change in the phase shifter is great is set to the phase amount. This phase difference means advancement of the phase just by 45 degrees as seen from −180 degrees. That is, this phase difference may be considered to be the same as that in the case of the first-order HPF described above. As described above, it can be seen that the third-order Butterworth gm-C LPF also has a desired characteristic as the phase shifter of the PLL circuit of the present invention.

Figure 15:
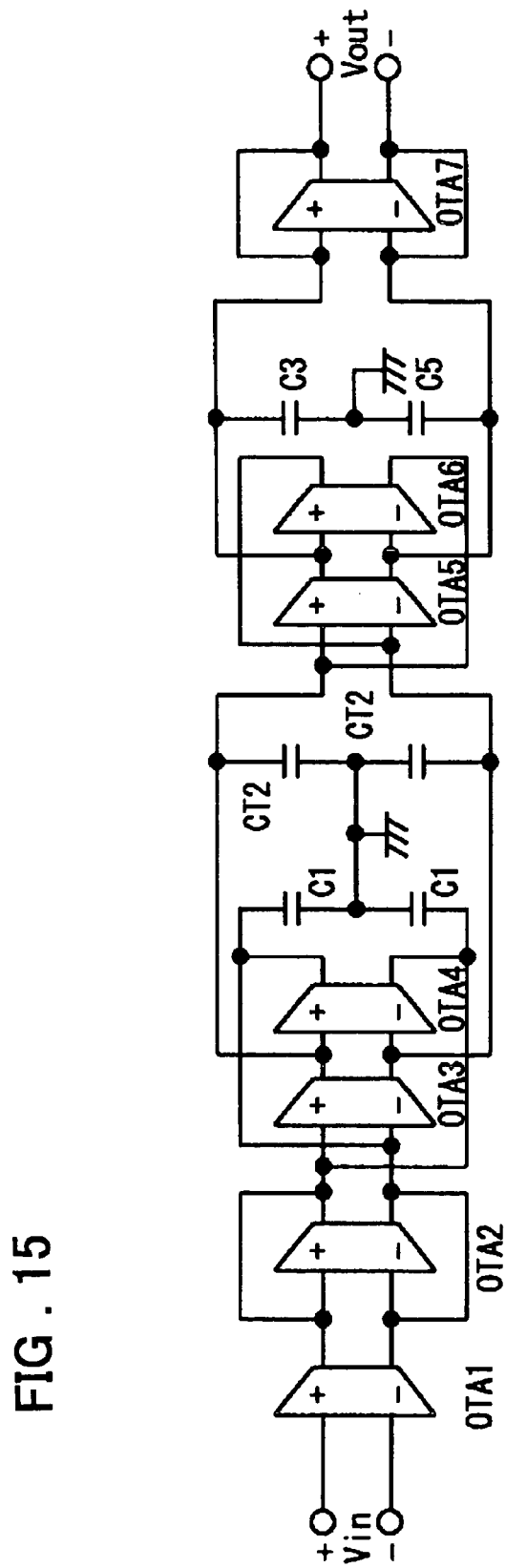
FIG. 15 is a diagram showing a circuit configuration of the third-order gm-C LPF of the fully differential type.

As described before, generally, when the OTA circuit is used as the single-ended circuit, the second-order distortion thereof increases. Thus, both of the single-ended third-order Butterworth gm-C LPFs shown in FIGS. 11 and 12 can be likewise changed to the one of the fully differential type shown in FIG. 15.

Figure 16:
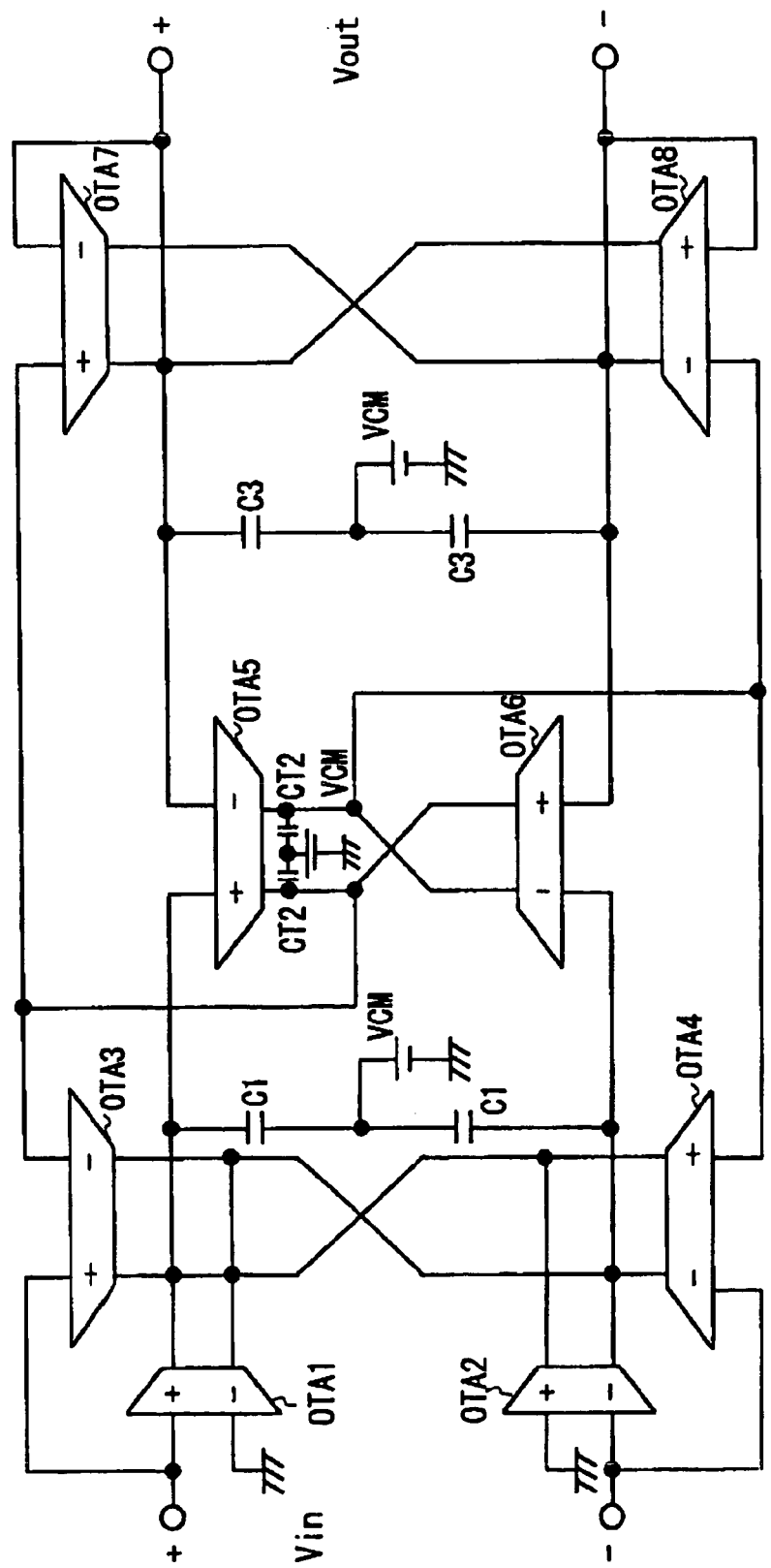
FIG. 16 is a diagram showing a circuit configuration of a third-order gm-C LPF of a pseudo differential type.

The single-ended third-order Butterworth gm-C LPF in FIG. 12, however, can also be changed to the one of a pseudo differential type as shown in FIG. 16. This filter includes the OTA1, OTA2, OTA3, OTA4, OTA5, OTA6, OTA7, and OTA8. The non-inverting input terminal (+) of the OTA1 is connected to the input terminal (+), while the inverting terminal (−) of the OTA1 is connected to the ground potential. The non-inverting input terminal (+) of the OTA3 is connected to the input terminal (+), while the differential output of the OTA3 is connected to the differential output of the OTA1. The non-inverting input terminal (+) of the OTA5 is connected to the non-inverting output terminal of the OTA1, while the inverting input terminal (−) of the OTA5 is connected to an output terminal (+). The non-inverting output terminal (+) of the OTA7 is connected to the non-inverting output terminal of the OTA5, while the inverting input terminal (−) of the OTA7 is connected to the output terminal (+). The inverting input terminal (−) of the OTA2 is connected to an input terminal (−), and the non-inverting input terminal (+) of the OTA2 is connected to the ground potential. The inverting input terminal (−) of the OTA4 is connected to the input terminal (−), and the differential output of the OTA4 is connected to the differential output of the OTA2. The inverting output terminal (−) of the OTA6 is connected to the inverting output terminal of the OTA2, and the non-inverting input terminal (+) of the OTA6 is connected to the output terminal (−). The inverting output terminal (−) of the OTA8 is connected to the inverting output terminal of the OTA6, and the non-inverting input terminal (+) is connected to the output terminal (−). The differential outputs of the OTA3 and the OTA4 are cross connected, the differential outputs of the OTA5 and the OTA6 are cross connected, and the differential outputs of the OTA7 and the OTA8 are cross connected. The non-inverting output terminal of the OTA1 and the inverting output terminal of the OTA2 are connected in common through the capacitors C1, respectively, and to the common connection node between the two capacitors C1, a control voltage VCM is applied. The differential outputs of the OTA5 are connected through the respective capacitors CT2, and to the common connection node between the two capacitors CT2, the control voltage VCM is applied. The non-inverting output terminal of the OTA7 and the inverting output terminal of the OTA8 are connected in common through the capacitors C3, respectively, and to the common connection node between the two capacitors C3, the control voltage VCM is applied.

As described above, in the PLL circuit according to the present invention, an odd-order gm-C LPF can be employed as the phase shifter 101, and in the filter of the third order or higher, by using the Butterworth gm-C LPF, the phase difference of 45 degrees can be obtained. However, generally, it rarely happens that the circuit size and current consumption of a control circuit such as the PLL circuit become greater than those of the gm-C filter to be controlled. That is, the circuit size and current consumption of the control circuit such as the PLL circuit are generally set to be equal to or less than that the gm-C filter. When control over the cutoff frequency with a high accuracy is required, the order of the phase shifter in the PLL circuit for control with the order of the gm-C filter may be matched.

The foregoing detailed description is directed to the cases where the first-order gm-C LPF and the third-order Butterworth gm-C LPF are employed as the phase shifter of the PLL circuit. Likewise, by using a fifth-order Butterworth gm-C LPF or a seventh-order Butterworth gm-C LPF, the phase difference of 45 degrees can be obtained and hence the PLL circuit of the present invention can be thereby implemented. When an odd-order Butterworth gm-C LPF is used, the phase difference of just 45 degrees can be obtained. However, since the phase difference around 45 degrees can be obtained by a filter other than the Butterworth gm-C LPF, as well, the phase shifter used in the PLL circuit of the present invention is not thereby limited to the Butterworth gm-C LPF. It is obvious that by using the odd-order gm-C LPF as the phase shifter, generally, a phase difference in accordance with the phase shifter can be obtained, and the reference voltage value should be set to the VDD/2 or less according to the phase difference.

Likewise, a third-order Butterworth gm-C HPF (High Pass Filter) can also be derived.

In a standardized third-order Butterworth HPF having an input resistance (1Ω) and a terminating resistance (1Ω), for example, L1 becomes equal to 1H, C2 becomes equal to ½F, and L3 becomes equal to 1H. Then, the transfer characteristic (function) is as follows:

$$H(s) = \frac{V_{out}}{V_{in}} = \frac{1}{2} \frac{s^3}{s^3 + 2s^2 + 2s + 1} \tag{13}$$

Then, the normalized angular frequency ω thereof is expressed as follows:

$$H(j\omega) = \frac{V_{out}}{V_{in}} = \frac{1}{2} \frac{-j\left(\frac{\omega}{\omega_0}\right)^3}{-j\left(\frac{\omega}{\omega_0}\right)^3 - 2\left(\frac{\omega}{\omega_0}\right)^2 + 2j\left(\frac{\omega}{\omega_0}\right) + 1} \tag{14}$$

Figure 17:
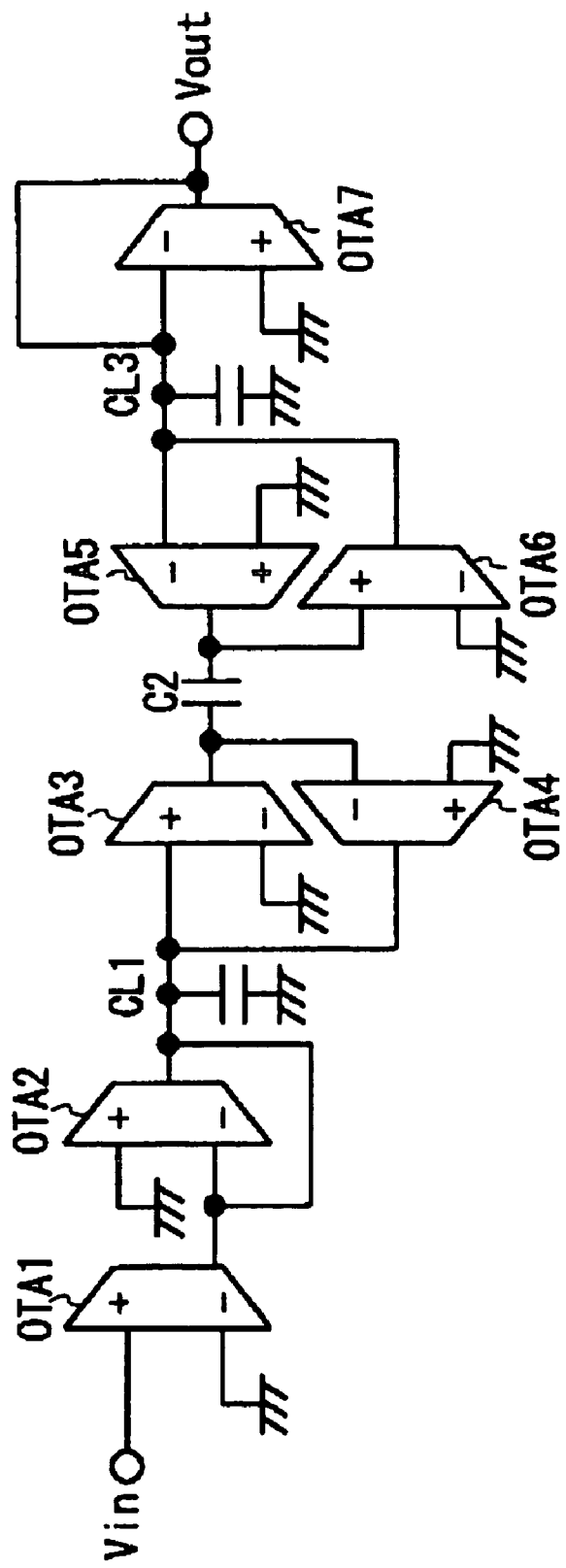
FIG. 17 is a diagram showing a circuit configuration of a single-ended third-order gm-C HPF used in the phase shifter in the diagram showing the PLL circuit of the present invention.

FIG. 17 shows a single-ended third-order Butterworth gm-C HPF. Referring to FIG. 17, the single-ended third-order Butterworth gm-C HPF includes the OTA1, OTA2, OTA3, OTA4, OTA5, OTA6, and OTA7. The non-inverting input terminal (+) of the OTA1 is connected to the input terminal (Vin), and the inverting input terminal (−) of the OTA1 is connected to the ground potential. The common connection node between the output of the OTA2 and the output of the OTA1 is connected to the inverting input terminal (−) of the OTA2. The non-inverting input terminal (+) of the OTA2 is connected to the ground potential. The non-inverting input terminal (+) of the OTA3 is connected to the output terminal of the OTA2 grounded through the capacitor CL1, and the inverting input terminal (−) of the OTA3 is connected to the ground potential. The non-inverting input terminal (+) of the OTA4 is connected to the ground potential, the inverting input terminal (−) of the OTA4 is connected to the output of the OTA3, and the output of the OTA4 is connected to the non-inverting input terminal (+) of the OTA3. The output of the OTA5 is connected to the output of the OTA3 through a capacitor C2, and the non-inverting input terminal (+) of the OTA5 is connected to the ground potential. The inverting input terminal (−) of the OTA6 is connected to the ground potential, and the non-inverting terminal (+) of the OTA6 is connected to the output of the OTA3. The non-inverting input terminal (+) of the OTA7 is connected to the ground potential, and the inverting input terminal (−) of the OTA7 is connected to the connection node between the output of the OTA6 and the output terminal Vout (grounded through a capacitor CL3).

Figure 18:
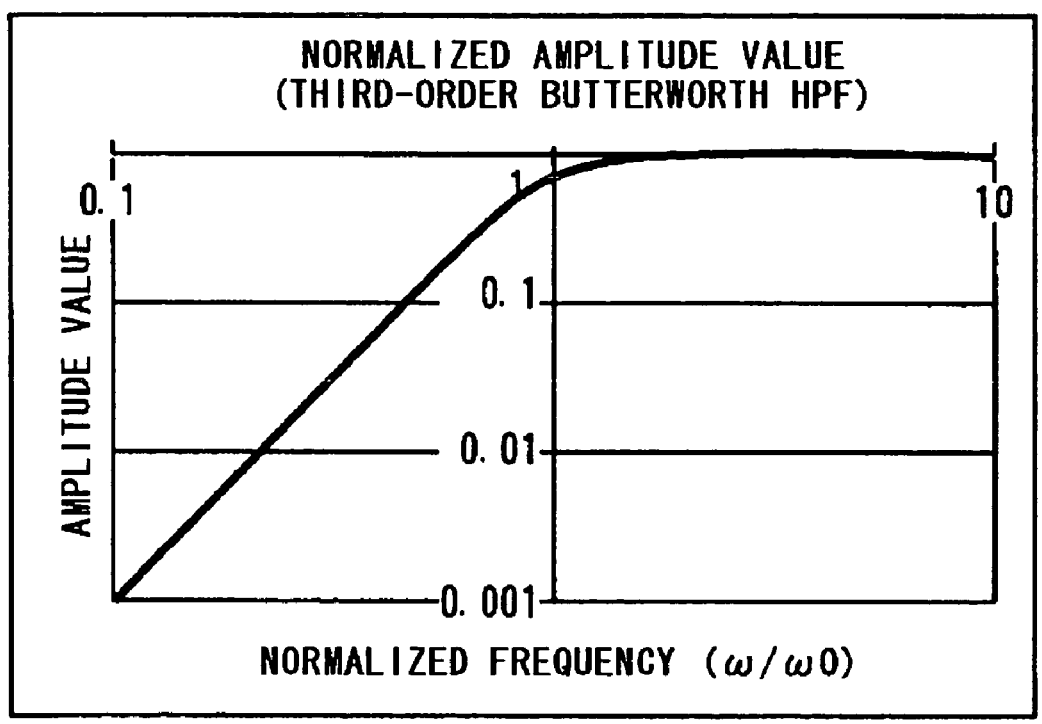
FIG. 18 is a graph showing an amplitude characteristic of the third-order gm-C HPF.
Figure 19:
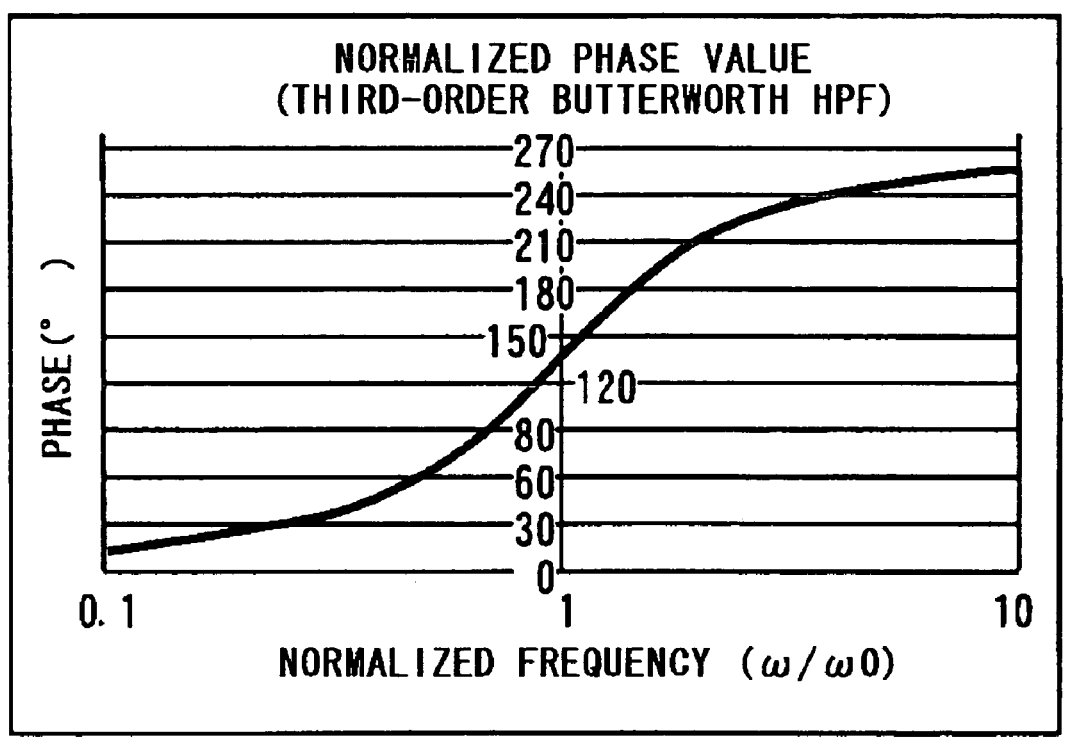
FIG. 19 is a graph showing a phase characteristic of the third-order gm-C HPF.

Accordingly, the amplitude characteristic becomes as shown in FIG. 18, while the phase characteristic becomes as shown in FIG. 19. That is, as is well known, the amplitude increases at 18 dB/Oct, while the phase changes from zero degrees to 270 degrees. At the cutoff frequency, the amplitude becomes −3.01 dB $(=1/\sqrt{2}=0.7071)$ with respect to the amplitude value at the time of the frequency of $\infty$, and the phase is advanced by just 135 degrees $(3\pi/4)$.

Accordingly, 135 degrees at which the phase change in the phase shifter is great is set to the phase amount. This phase difference means delay of the phase just by 45 degrees as seen from −180 degrees. That is, this phase difference may be considered to be the same as that in the case of the first-order LPF described above.

As described above, it can be seen that the third-order Butterworth gm-C HPF also has a desired characteristic as the phase shifter of the PLL circuit of the present invention.

Figure 20:
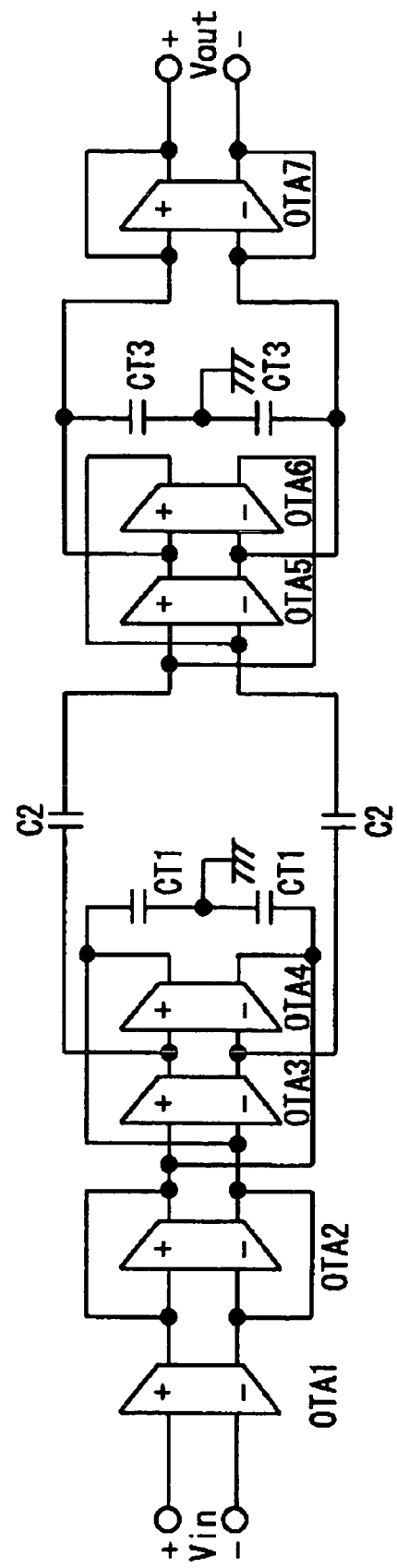
FIG. 20 is a diagram showing a circuit configuration of the third-order gm-C HPF of the fully differential type.

Generally, when the OTA circuit is used as the single-ended circuit, the second-order distortion thereof increases. Thus, the single-ended third-order gm-C HPF shown in FIG. 17 as well can be likewise changed to the one of the fully differential type shown in FIG. 20.

However, generally, it rarely happens that the circuit size and current consumption of the control circuit such as the PLL circuit is increased more than those of the gm-C filter to be controlled. The circuit size and current consumption of the control circuit such as the PLL circuit are set to be equal to or less than those of the gm-C filter. When control over the cutoff frequency with a high accuracy is required, the order of the phase shifter in the PLL circuit for control with the order of the gm-C filter can be matched. By combining the LPF (Low Pass Filter) with the HPF (High Pass Filter), for example, a BPF (Band Pass Filter) with a predetermined order can also be implemented.

The foregoing description is directed to the case where the first-order gm-C HPF and the third-order Butterworth gm-C HPF are used as the phase shifter of the PLL circuit in detail. Likewise, by using a fifth-order Butterworth gm-C HPF and a seventh-order Butterworth gm-C HPF as well, the phase difference of 45 degrees can be obtained. The PLL circuit of the present invention can be thereby implemented.

When an odd-order Butterworth gm-C HPF is used, the phase difference of just 45 degrees can be obtained. However, the phase difference of around 45 degrees can be obtained by other filter than the Butterworth gm-C HPF as well. Thus, the phase shifter used in the PLL circuit of the present invention is not limited to the Butterworth gm-C HPF. It is obvious that by using an odd-order gm-C HPF as the phase shifter, generally, a phase difference in accordance with the phase shifter can be obtained, and the reference voltage value should be set to the VDD/2 or less according to the phase difference.

Next, it is assumed that when a typical driving current for the OTA circuit is changed, the value of the transconductance gm is changed in proportion to the square root ($\sqrt{}$) of the driving current. Except for the example of the OTA circuit used in the conventional art described above, the gm values of almost all the OTA circuits change in proportion to the square ($\sqrt{}$) root of the driving current (tail current).

Figure 21:
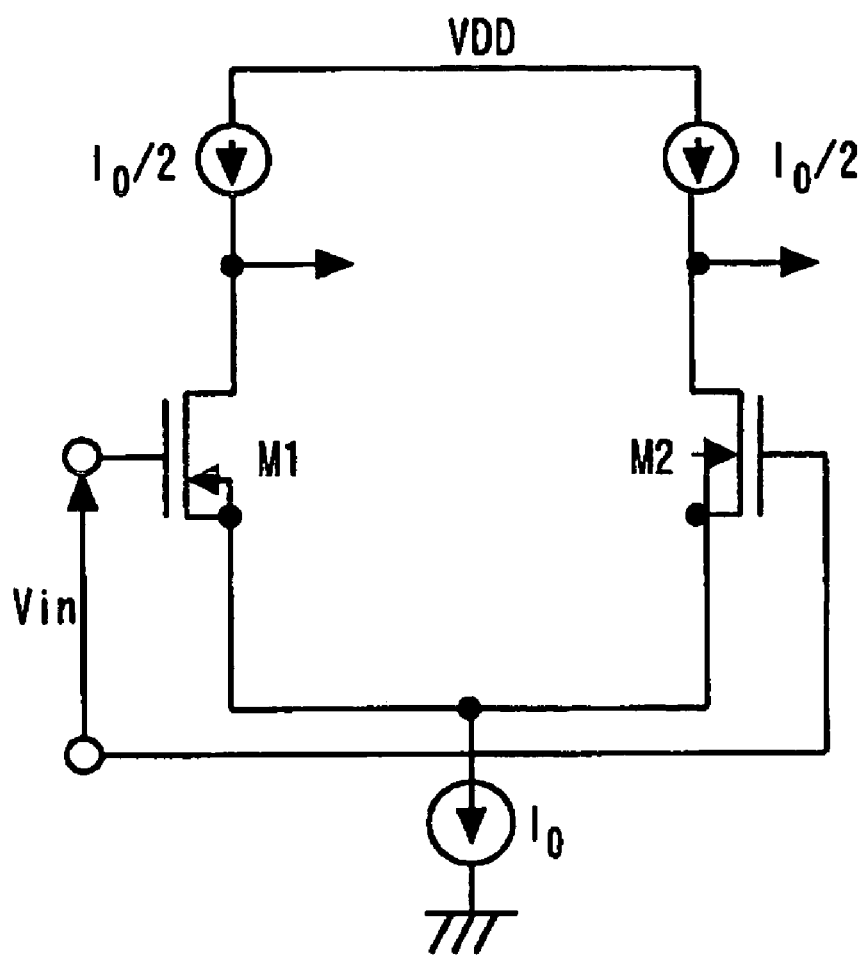
FIG. 21 is a diagram showing a first example of an OTA circuit.
Figure 22:
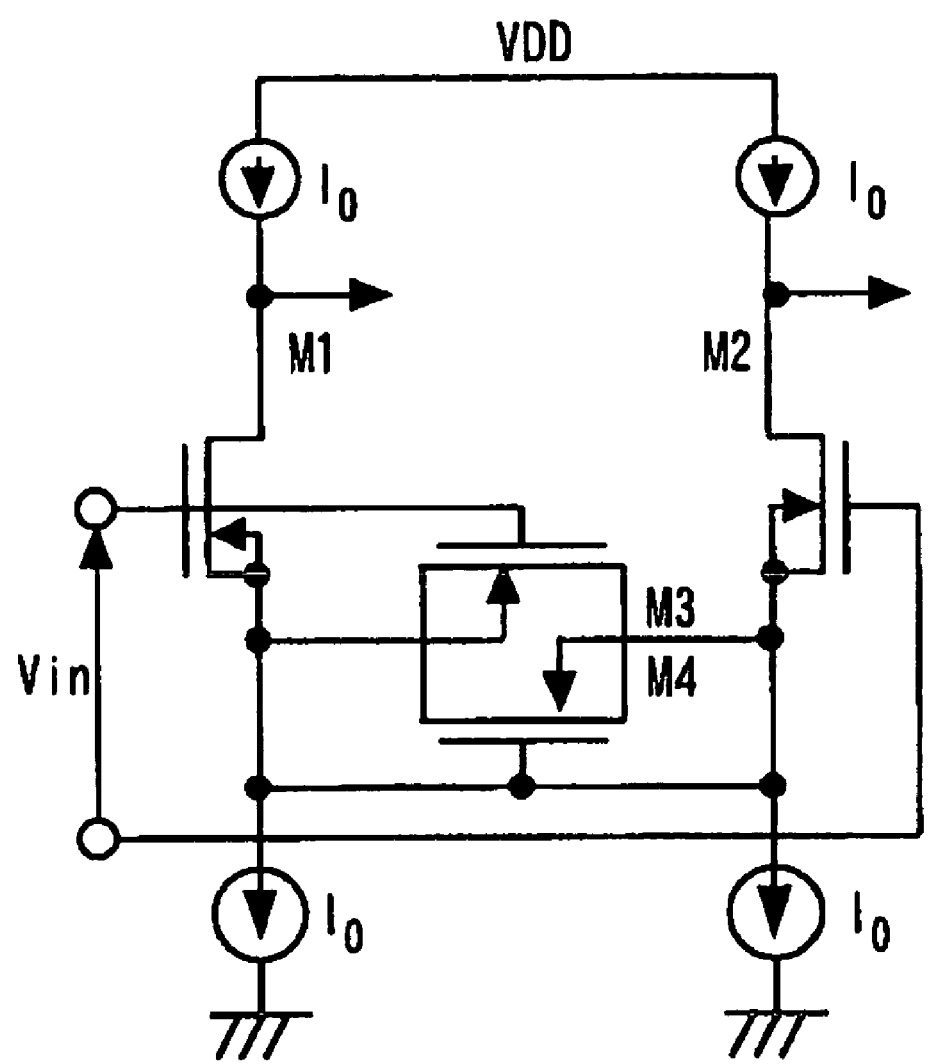
FIG. 22 is a diagram showing a second example of the OTA circuit.
Figure 23:
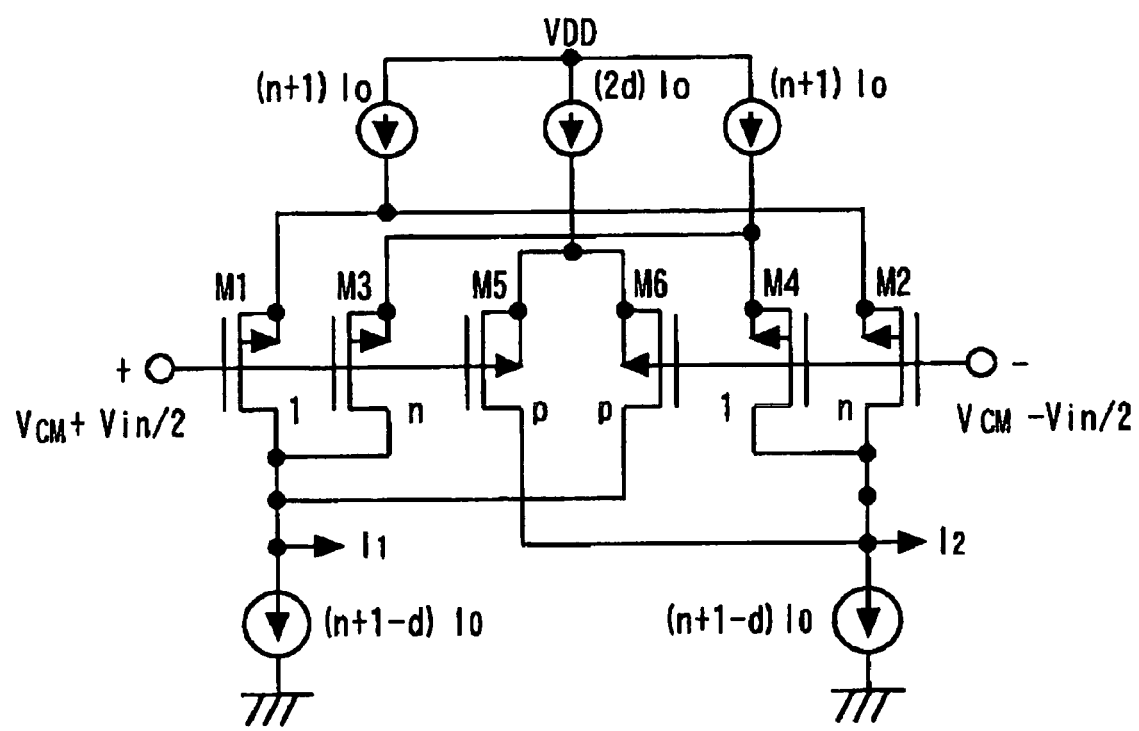
FIG. 23 is a diagram showing a third example of the OTA circuit.

For example, an OTA circuit having an MOS differential pair shown in FIG. 21 is often used, and an OTA circuit as shown in FIG. 22, in which two transistors basically operate as degeneration resistances though the operating regions of the two transistors change from a linear region to a saturation region as an input voltage is increased, is often used. Further, an OTA circuit as shown in FIG. 23, constituted from three pairs of composite differential pairs is often used. In this circuit, the outputs of an MOS differential pair are connected to cross-connected pairs in opposite directions. The cross-connected pairs are constituted from two pairs of unbalanced differential pairs in which the gates and drains of transistors having different sizes are connected in common to each other. In the OTA circuit shown in FIG. 23, the gates of the transistors M1 and M3 are connected in common to the plus terminal (with a voltage thereof being VCM+Vin/2), and the drains of the transistors M1 and M3 are connected in common to a constant current source (with a current value thereof being (n+1−d) I0), and the W/L (gate width/gate length) ratios of the transistor M1 and the transistor M3 are set to 1 to n. The gates of the transistors M2 and M4 are connected in common to a minus terminal (with a voltage thereof being VCM−Vin/2), the drains of the transistors M2 and M4 are connected in common to a constant current source (with a current value thereof being (n+1−d) I0), and the W/L (gate width/gate length) ratios of the transistor M2 and transistor M4 are set to n to 1. The sources of the transistors M1 and M2 that constitute a first differential pair are connected in common to a power supply VDD through a constant current source (with a current value of (n+1) I0), while the sources of the transistors M3 and M4 that constitute a second differential pair are connected in common to the power supply VDD through a constant current source (n+1) I0. Further, the transistors M5 and M6 are included. The gates of the transistors M5 and M6 are connected to the plus terminal and the minus terminal, respectively, and the sources of the transistors M5 and M6 are connected in common to the power supply VDD through a constant current source (with a current value of (2d) I0). The drains of the transistors M5 and M6 are connected to the drains of the transistors M1 and M3 connected in common and the drains of the transistors M2 and M4 connected in common, respectively. The transistors M5 and M6 constitute a third differential pair.

When the OTA circuit as described above is employed, the respective driving currents for the OTA circuits that constitute the first-order filter and the OTA circuit that constitutes the gm-C filter must be controlled through a V/I converter that converts the control voltage VCON to a control circuit ICON, and the OTA circuits must be set to predetermined gm values.

Figure 24:
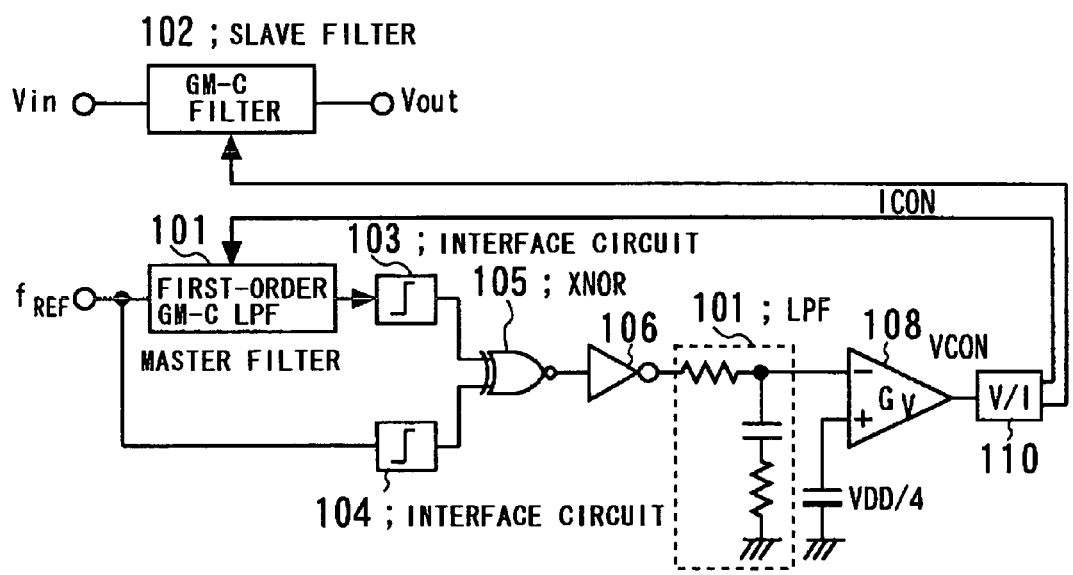
FIG. 24 is a diagram showing a configuration of a PLL circuit according to a second embodiment of the present invention.

Next, another embodiment of the present invention will be described. FIG. 24 shows a modified PLL circuit in which the control voltage VCON is converted to the control current ICON through a V/I converter 110 to adjust the driving currents for the OTA, thereby setting the gm values. This V/I converter 110 may be an MOS transistor with the source thereof grounded, for example.

As is well known, due to the manufacturing variations of MOS transistors and variations of the gm values and threshold voltages VT, variations of drain current values are increased even if a constant gate voltage is applied. However, by setting the voltage gain GV of the differential amplifier in the preceding state, the MOS transistor can compress the influence of the variations to 1/GV. The operation principle therefor is as described in detail heretofore. Likewise, the PLL circuit can be implemented by using the odd-order gm-C filter described above as the phase shifter.

The following two approaches for the implementation of the filter are known:
  (i) LCR ladder approach
  (ii) biquad approach Thus, there are provided the following approaches according to the above approaches for the implementation of the gm-C filters:
  (i) approach of emulating an LCR ladder filter
  (ii) biquad approach In the approach of emulating the LCR ladder filter, the element sensitivity of the configuration of the LCR ladder filter is low, so that the characteristic variations of the filter is reduced to be small with respect to element variations caused by the manufacturing variations. As described above, in the filter circuit implemented by replacement with the LCR ladder filter, the sensitivity of the circuit to the variations of the elements of the circuit is low. Since there are process parameter variations and temperature variations that cannot be foreseen, this is particularly important when the filters are integrated.

On the other hand, in the biquad approach, a cascaded biquad filter is more common and the transfer function thereof is expressed by the quotient of two polynomial expressions. The gm-C filter, however, can be implemented by any filter expressed by the polynomial expression in which the degree of a denominator is equal to or higher than the degree of a numerator.

Accordingly, if a differential gm-C filter is implemented, the same biquad block can be repeated for use. The layout of the filter is thereby simplified, with less modifications. The biquad approach is especially suitable for the filter in which specific zero point and poles are digitally controlled, thereby programmable to desired values.

In regard to the circuit size and the power consumption, the number of the OTAs is reduced more in the filter implemented by the biquad approach, and thus becomes more advantageous. In the LCR ladder filter in particular, when there are an input resistance ($R_{in}$) and a terminating resistance ($R_{out}$) of an output, an insertion loss is generated in the filter. Then, it becomes necessary to add an OTA so as to compensate for this insertion loss or to increase the gm value by increasing the driving current for the OTA in a first input stage.

Further, as is scarcely recognized, there is generated a difference between the frequency characteristics of the filters. It is known that in common amplifiers, the product (GB product) of a gain (G) and a frequency band (B) in a certain bias condition, becomes constant. In the gm-C filter that uses the OTA as well, the same phenomenon appears. That is, even if the OTA that use the constant driving current is employed for configuration, the band of the first-order LPF constituted from a CR with the insertion loss of 6 dB, including equal input and terminating resistances may be considered to be equal to be substantially twice the band of the first-order LPF constituted from a CR with the insertion loss of 0 dB.

Figure 25:
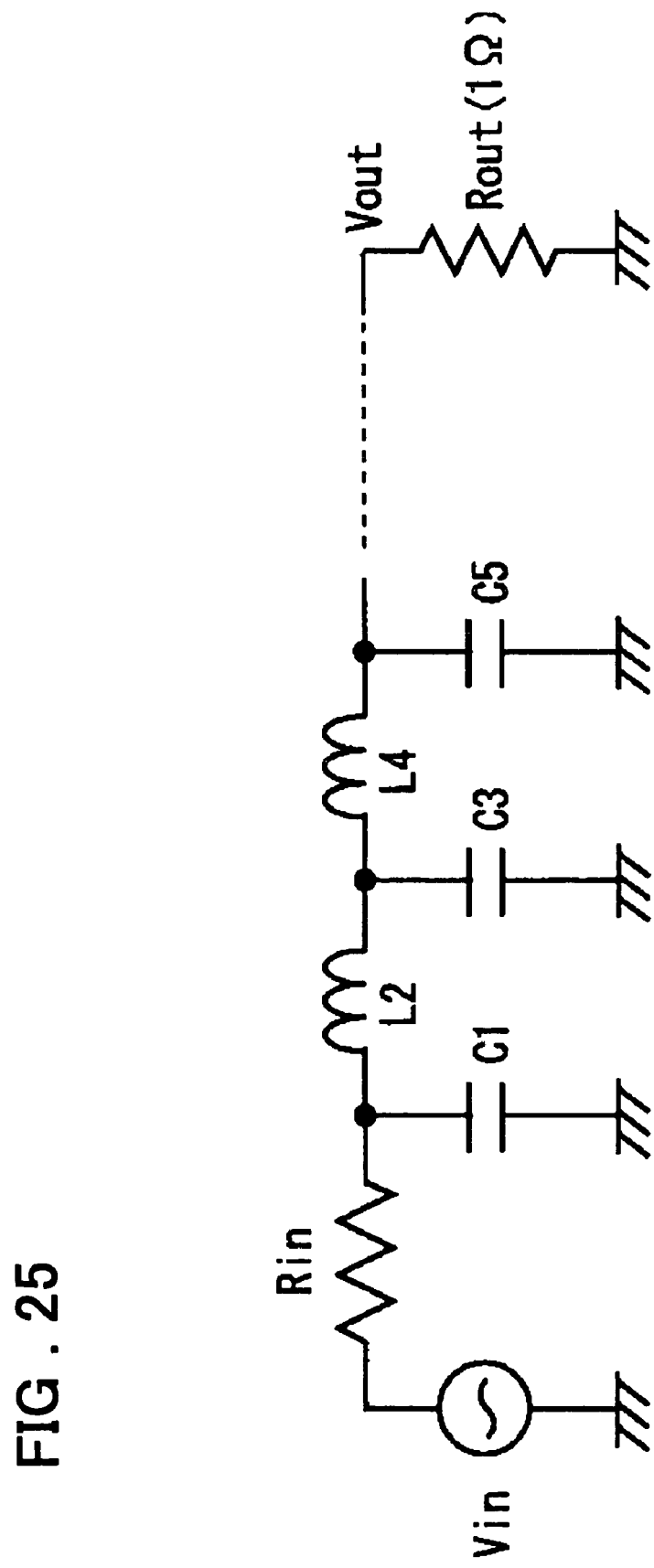
FIG. 25 is a diagram showing a circuit configuration of an RLC ladder LPF with an order of n.

Specifically, normalized parameter values of elements L and C for an nth-order Butterworth LCR ladder LPF as shown in FIG. 25 are expressed as shown in FIG. 26.

That is, depending on whether the input resistance ($R_{in}$) (or the terminating resistance ($R_{out}$)) is present or not, the minimum parameter values for the elements are different just by a factor of two. That is, this also holds true for the gm-C filter as well. When the minimum capacitance values of the capacitors C added to the circuits of the two gm-C filters using the common OTA circuits are made to be equal in the two gm-C filters, the cut-off frequencies of these two gm-C filters will be different just by a factor of two.

Further, it can also be seen that as the order of the filter increases, these minimum parameter values for the elements are gradually reduced. That is, depending on whether the input resistance (Rin) (or the terminating resistance (Rout)) is present or not, and by making the order of the phase shifter of the PLL circuit to be different from the order of the gm-C filter to be controlled, the influence of the value of parasitic capacitors such as interconnect capacitor can be reduced, so that the cut-off frequency of the gm-C filter can be automatically tuned with a high accuracy even if the cut-off frequency of the phase shifter of the PLL circuit and the cut-off frequency of the gm-C filter to be controlled are made to be different by a factor of a few.

That is, when the capacitor C added to the circuit is reduced, the influence of the parasitic capacitor such as the interconnect capacitor caused by the layout of the OTA appears on the characteristic. Especially when the capacitor C added to the circuit is great, the parasitic capacitor such as the interconnect capacitor become relatively small, so that the influence of the parasitic capacitor is basically small. However, when the capacitor C added to the circuit is reduced, the parasitic capacitor such as the interconnect capacitor become relatively large, so that the influence of the parasitic capacitor becomes marked.

Then, if the minimum capacitance values of the capacitors C added to the circuit using the common OTA circuit are made to be equal, it can be expected that the influence of the parasitic capacitor becomes substantially the same in both of the phase shifter in the PLL circuit and the gm-C filter to be controlled. Further, with regard to the presence or absence of the input resistance (Rin) or the terminating resistance (Rout), it also holds true in the case of the biquad approach. Though the gm-C filter implemented by the biquad approach has no insertion loss, it is equivalent to the case where the input resistance (Rin) or the terminating resistance (Rout) is absent.

In order to match the characteristic of the odd-order filter (master filter) that constitutes the phase shifter 101 within the loop of the PLL with the characteristic of the gm-C filter (slave filter) to be controlled, it is necessary to consider the influence of the parasitic capacitors or the like. It is because when the capacitor C added to the circuit is reduced, the influence of the value of the parasitic capacitors such as the interconnect capacitor caused by the layout of the OTAs becomes manifest on the characteristics.

When the cut-off frequency of the master filter is in the same band as the frequency band of the slave filter, and if the gm-C filters of the same type are used, it can be expected that the influence of the parasitic capacitors or the like can be reduced to a negligible level, even if the orders of the gm-C filters are different.

However, when the cut-off frequency of the master filter is not in the same band as the frequency band of the slave filter, it is necessary to consider the influence of the parasitic capacitors or the like deliberately. Generally, it is preferable that the reference frequency for control is set to the one in the stop band of the filter, and the S/N ratio of the slave filter is determined so that a clock slew to the slave filter is reduced, thereby preventing deterioration of the characteristics of the slave filter. However, when the cut-off frequency of the master filter is increased to that in the frequency band of the slave filter by several times, it is essential to match the OTA characteristics of the master filter with the OTA characteristics of the slave filter. Thus, the higher the cut-off frequency of the master filter is made, the more inevitable it is to make the capacitance value of the master filter to be smaller than the capacitance value of the slave filter, and it appears that the value of the parasitic capacitors such as the interconnect capacitor caused by the layout becomes the capacitance value that can no longer be ignored.

As a measure against this, the gm values of the OTAs in the master filter should be increased correspondingly according to an increase in the cut-off frequency. In the case of a bipolar OTA, though the gm value of the bi-polar OTA is increased in proportion to the driving current therefor, the gm value of an MOS OTA is only increased just in proportion of the square root ($\sqrt{}$) of the value of the driving current.

In order to double the gm value, for example, it is necessary to increase the driving current by a factor of four. Then, in order to increase the gm value by a factor of three, it is necessary to increase the driving current by a factor of nine.

On the other hand, by connecting two or three OTAs in parallel, the gm value can be increased by a factor of two or three. In this case, the total sum (circuit current) of the driving currents is increased just a factor of two or three.

An approach in which the gm value is increased by a factor of n by connecting n OTAs in parallel is attractive in terms of a current efficiency. However, the value of the parasitic capacitors such as the interconnect capacitor caused by the layout of the OTAs is also increased by a factor of n. Thus, the ratio of the value of the parasitic resistances to the value of the capacitor added to the circuit increases to a level that cannot be ignored, so that the influence of the parasitic capacitors appears.

On contrast therewith, in the slave filter, the OTA is used alone, without being connected in parallel. Since the frequency band of the filter is also low, the value of the capacitor added to the circuit also becomes large. Thus, the ratio of the value of the parasitic capacitors to the value of the capacitor added to the circuit is negligibly small, so that the influence of the parasitic capacitors can be generally ignored.

When reduced current consumption of the circuit in particular is promoted, the driving current for the OTA also needs to be reduced. The gm value of the OTA also becomes the minimum value for implementation of the filter, and the value of the capacitor added to the circuit is also reduced, corresponding to the gm value.

Accordingly, the influence of the parasitic capacitors on the filter characteristics as described above will become large. The master filter, in particular, of which the frequency is set to be high, is all the more influenced, and it gradually becomes difficult for the characteristics of the master filter to be matched with the characteristics of the slave filter.

In consideration of the above, by applying the LCR ladder approach and the biquad approach described above, or by applying the filter circuits with the insertion loss of 6 dB and 0 dB using the LCR ladder approach to the master filer and the slave filter, respectively when the cut-off frequency of the master filter and the frequency band of the slave filter are made to be different by a factor of approximately two, it can be seen that the value of the capacitor added to the circuit in the master filter and the value of the capacitor added to the circuit in the slave filter can be made to be substantially the same even if the OTAs for the same circuit, with the driving currents thereofor being the same are used.

The influence of the parasitic capacitors becomes marked when the value of the capacitor added to the circuit is reduced. Accordingly, by making the minimum capacitance values among the values of the capacitors added to the circuit to be the same both in the master filter and the slave filter, the influence of the parasitic capacitors can be limited to the minimum.

With this arrangement, the characteristic of the odd-order filter (master filter) that constitutes the phase shifter within the loop of the PLL can be matched with the characteristic of the gm-filter (slave filter) to be controlled, so that variations in the characteristic of the filter due to variations in the elements caused by the manufacturing variations or the like can be reduced.

Accordingly, by using the odd-order LPF or the odd-order HPF with the terminating resistance and the insertion loss of 6 dB as the phase shifter, the characteristic of the frequency increased by a factor of around two can be secured. Thus, even if the reference frequency is set to be about twice as the cut-off frequency of the gm-C filter, which is the slave filter, by a factor of around two times, the value of the capacitor that constitutes the gm-C filter can be implemented by substantially the same value of the capacitor C of the master filter. Accordingly, the characteristics of the master filter can be matched with the characteristics of the slave filter to such an extent that the value of the parasitic capacitors such as the interconnect capacitor caused by the layout of the OTAs can be ignored. Filter characteristic variations with respect to the variations of the elements caused by the manufacturing variations or the like can be reduced. Further, by making the ratio of the input resistance to the terminating resistance to be different, the frequency characteristic can be readily changed. Thus, increased matching with the value of the capacitor C of the gm-C filter, which is the slave filter, can be obtained.

Though the foregoing description was given to the present invention in connection with the embodiments described above, the present invention is not limited to the configurations of the embodiments described above, and of course includes various variations and modifications that could be made by those skilled in the art within the scope of the present invention.

It should be noted that other objects, features and aspects of the present invention will become apparent in the entire disclosure and that modifications from the disclosed embodiments may be done without departing the scope of the present invention claimed as appended herewith.

Also it should be noted that any combination of the disclosed and/or claimed elements, matters and/or items may fall under the modifications aforementioned.

What is claimed is:

1. A PLL circuit comprising:
   a phase shifter including a transconductance amplifier (referred to as an "OTA") and a capacitor, said phase shifter receiving an alternating current (AC) signal with a predetermined frequency as an input signal and outputting a signal obtained by shifting a phase of the input signal by a predetermined phase;

a phase comparator for receiving the input signal fed to said phase shifter and an output signal from said phase shifter and outputting a signal corresponding to a phase difference between the received signals;

a loop filter for receiving the output signal from said phase comparator and outputting a direct current (DC) voltage; and a differential amplifier for receiving and differentially amplifying the output voltage of said loop filter and a reference voltage;

wherein an output voltage of said differential amplifier or a signal obtained by converting the output voltage to a current by a voltage-to-current converter circuit is fed-back to said phase shifter as a control signal and a transconductance (gm) of the OTA constituting said phase shifter is controlled based on said control signal so as to make the phase difference given by said phase shifter become a constant value; and wherein the reference voltage is set to be less than a half of a power supply voltage.

2. The PLL circuit according to claim 1, wherein said phase shifter shifts the phase by 45 degrees; and wherein the reference voltage is set to one fourth of the power supply voltage.

3. The PLL circuit according to claim 1, further comprising:

a charging unit for charging at least one capacitor constituting said loop filter for receiving the output signal from said phase comparator and outputting the DC voltage;

said capacitor being charged to a voltage substantially equal to the reference voltage, by said charging unit.

4. The PLL circuit according to claim 3, wherein said charging unit includes a switching circuit for controlling on and off of a connection between said at least one capacitor constituting said loop filter and the reference voltage.

5. A circuit having a phase locked loop (PLL), comprising:

a phase shifter comprising a transconductance amplifier (referred to as an "OTA") and a capacitor, said phase shifter receiving an alternating current (AC) signal with a predetermined frequency as an input signal and outputting a signal obtained by shifting a phase of the input signal by a predetermined phase, said phase shifter further including an odd-order filter;

a phase comparator for receiving the input signal fed to said phase shifter and an output signal from said phase shifter and outputting a signal corresponding to a phase difference between the received signals;

an amplifier for amplifying a direct current (DC) voltage of the output signal from said phase comparator, an output of said amplifier providing said control signal to change said transconductance (gm) of the OTA, said amplifier comprising a differential amplifier for receiving and differentially amplifying the direct current (DC) voltage and a reference voltage; and a filter for smoothing the output of said phase comparator, said filter integrally provided with said differential amplifier, wherein a transconductance (gm) of the OTA comprising said phase shifter is changed based on said phase difference, as a control signal to make the phase difference given by said phase shifter become a constant value.

6. The circuit according to claim 5, wherein the reference voltage is set to a voltage equal to or less than a half of a power supply voltage.

7. The circuit according to claim 6, wherein the reference voltage is set to one fourth of the power supply voltage.

* * * * *